(12) United States Patent
Nowatari et al.

US009023491B2

(10) Patent No.: US 9,023,491 B2
(45) Date of Patent: *May 5, 2015

(54) LIGHT-EMITTING ELEMENT, LIGHT-EMITTING DEVICE, ELECTRONIC DEVICE, AND LIGHTING DEVICE

(75) Inventors: Hiromi Nowatari, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 397 days.

This patent is subject to a terminal disclaimer.

(21) Appl. No.: 13/051,104

(22) Filed: Mar. 18, 2011

(65) Prior Publication Data

US 2011/0233530 A1 Sep. 29, 2011

(30) Foreign Application Priority Data

Mar. 23, 2010 (JP) ................. 2010-066296

(51) Int. Cl.
*H01L 51/54* (2006.01)
*C09K 11/06* (2006.01)
*H01L 51/50* (2006.01)
*H01L 51/00* (2006.01)

(52) U.S. Cl.
CPC ........ *H01L 51/5048* (2013.01); *H01L 51/0078* (2013.01); *H01L 51/0072* (2013.01); *H01L 51/5068* (2013.01); *H01L 51/506* (2013.01); *H01L 51/5092* (2013.01); *Y10S 428/917* (2013.01)

(58) Field of Classification Search
None
See application file for complete search history.

(56) References Cited

U.S. PATENT DOCUMENTS

| | | | |
|---|---|---|---|
| 5,998,803 A | 12/1999 | Forrest et al. | |
| 6,013,384 A | 1/2000 | Kido et al. | |
| 7,192,659 B2 | 3/2007 | Ricks et al. | |
| 7,388,100 B2 | 6/2008 | Nishio | |
| 7,462,883 B2 | 12/2008 | Kumaki et al. | |
| 7,494,722 B2 | 2/2009 | Liao et al. | |
| 7,560,862 B2 | 7/2009 | Liao et al. | |
| 7,564,052 B2 | 7/2009 | Kumaki et al. | |
| 7,598,670 B2 | 10/2009 | Kumaki et al. | |
| 7,683,536 B2 | 3/2010 | Forrest et al. | |
| 7,893,427 B2 | 2/2011 | Kumaki et al. | |
| 7,960,038 B2 | 6/2011 | Ohsawa et al. | |
| 8,084,766 B2 | 12/2011 | Werner et al. | |
| 8,164,088 B2 | 4/2012 | Ohsawa et al. | |
| 8,368,059 B2 | 2/2013 | Kumaki et al. | |
| 8,368,060 B2 | 2/2013 | Kumaki et al. | |
| 8,502,200 B2 | 8/2013 | Schwartz et al. | |
| 8,742,407 B2 | 6/2014 | Ohsawa et al. | |
| 8,872,169 B2 | 10/2014 | Kumaki et al. | |
| 2002/0180347 A1 | 12/2002 | Adachi et al. | |
| 2003/0127967 A1 | 7/2003 | Tsutsui et al. | |
| 2003/0189401 A1 | 10/2003 | Kido et al. | |
| 2004/0227460 A1* | 11/2004 | Liao et al. | 313/506 |
| 2004/0262614 A1 | 12/2004 | Hack et al. | |
| 2005/0098207 A1* | 5/2005 | Matsumoto et al. | 136/263 |
| 2005/0104511 A1 | 5/2005 | Liao et al. | |
| 2005/0110007 A1 | 5/2005 | Forrest et al. | |
| 2006/0008740 A1 | 1/2006 | Kido et al. | |
| 2006/0087225 A1 | 4/2006 | Liao et al. | |
| 2006/0115673 A1 | 6/2006 | Li | |
| 2006/0188745 A1 | 8/2006 | Liao et al. | |
| 2006/0220534 A1 | 10/2006 | Shibanuma et al. | |
| 2006/0251921 A1 | 11/2006 | Forrest et al. | |
| 2006/0251922 A1 | 11/2006 | Liao et al. | |
| 2006/0263629 A1 | 11/2006 | Aziz et al. | |
| 2006/0292394 A1 | 12/2006 | Iwaki et al. | |
| 2007/0001570 A1* | 1/2007 | Nomura et al. | 313/113 |
| 2007/0003788 A1 | 1/2007 | Tagami et al. | |
| 2007/0020483 A1 | 1/2007 | Park et al. | |
| 2007/0040161 A1 | 2/2007 | Kumaki et al. | |
| 2007/0090376 A1 | 4/2007 | Kumaki et al. | |
| 2007/0114512 A1 | 5/2007 | Kumaki et al. | |
| 2007/0114527 A1 | 5/2007 | Kumaki et al. | |
| 2007/0116983 A1 | 5/2007 | Kanno et al. | |
| 2007/0120136 A1 | 5/2007 | Noda et al. | |

(Continued)

FOREIGN PATENT DOCUMENTS

| | | |
|---|---|---|
| CN | 101034736 A | 9/2007 |
| CN | 102195002 A | 9/2011 |
| EP | 1 833 104 A2 | 9/2007 |
| EP | 2 365 556 A2 | 9/2011 |
| JP | 04-297076 A | 10/1992 |
| JP | 10-270171 A | 10/1998 |
| JP | 2003-272860 A | 9/2003 |
| JP | 2004-031212 A | 1/2004 |
| JP | 2004-346082 A | 12/2004 |
| JP | 2005-209643 A | 8/2005 |

(Continued)

OTHER PUBLICATIONS

Liao, L.S. et al., "High-Efficiency Tandem Organic Light-Emitting Diodes," Applied Physics Letters, vol. 84, No. 2, Jan. 12, 2004, pp. 167-169.

(Continued)

*Primary Examiner* — Andrew K Bohaty
(74) *Attorney, Agent, or Firm* — Husch Blackwell LLP

(57) ABSTRACT

Provided are a light-emitting element in which a driving voltage increase can be suppressed and a light-emitting device which has reduced power consumption by including the light-emitting element. The element includes an EL layer between an anode and a cathode, and has a first, a second, and a third layer between the cathode and the EL layer. The first layer is between and in contact with the cathode and the second layer and includes a hole-transport substance. The second layer is between and in contact with the first the third layers and includes a phthalocyanine-based material. The third layer is between and in contact with the second and EL layers and includes an alkali metal, an alkaline-earth metal, a rare-earth metal, an alkali metal compound, an alkaline-earth metal compound, or a rare-earth metal compound. The phthalocyanine-based material has a metal-oxygen bond.

33 Claims, 21 Drawing Sheets

(56) References Cited

U.S. PATENT DOCUMENTS

| | | | |
|---|---|---|---|
| 2007/0129545 | A1 | 6/2007 | Inoue et al. |
| 2007/0182317 | A1 | 8/2007 | Kido et al. |
| 2007/0200125 | A1 | 8/2007 | Ikeda et al. |
| 2007/0210322 | A1* | 9/2007 | Ohsawa et al. ............... 257/79 |
| 2007/0222376 | A1 | 9/2007 | Ohsawa et al. |
| 2008/0135858 | A1 | 6/2008 | Yamazaki et al. |
| 2008/0278064 | A1 | 11/2008 | Kumaki et al. |
| 2009/0102366 | A1 | 4/2009 | Ushikubo et al. |
| 2009/0167158 | A1* | 7/2009 | Kathirgamanathan et al. ............... 313/504 |
| 2009/0167168 | A1 | 7/2009 | Seo et al. |
| 2010/0133523 | A1 | 6/2010 | Nowatari et al. |
| 2010/0133573 | A1 | 6/2010 | Nowatari et al. |
| 2010/0282309 | A1 | 11/2010 | Pschirer et al. |
| 2010/0301316 | A1 | 12/2010 | Nowatari et al. |
| 2010/0301317 | A1 | 12/2010 | Nowatari et al. |
| 2011/0057179 | A1 | 3/2011 | Nowatari et al. |
| 2011/0215307 | A1 | 9/2011 | Nowatari et al. |
| 2011/0240971 | A1 | 10/2011 | Nowatari et al. |
| 2011/0240972 | A1 | 10/2011 | Nowatari et al. |
| 2012/0025171 | A1 | 2/2012 | Canzler et al. |
| 2014/0264304 | A1 | 9/2014 | Ohsawa et al. |

FOREIGN PATENT DOCUMENTS

| | | |
|---|---|---|
| JP | 2007-165171 A | 6/2007 |
| JP | 2008-535266 | 8/2008 |
| WO | WO 01/15244 A1 | 3/2001 |
| WO | WO 2006/009262 A1 | 1/2006 |
| WO | WO 2006/105387 A2 | 10/2006 |
| WO | WO 2007/130047 A1 | 11/2007 |
| WO | WO 2008/077615 A1 | 7/2008 |

OTHER PUBLICATIONS

Tsutsui, T. et al., "Electric Field-Assisted Bipolar Charge Spouting in Organic Thin-Film Diiodes," Applied Physics Letters, vol. 84, No. 3, Jan. 19, 2004, pp. 440-442.

Ikeda, H. et al., "P-185: Low-Drive-Voltage OLEDs With a Buffer Layer Having Molybdenum Oxide," SID Digest '06: SID International Symposium Digest of Technical Papers, vol. 37, 2006, pp. 923-926.

Birnstock, J. et al., "54.3: Distinguished Paper: White Stacked OLED With 35 lm/W and 100,000 Hours Lifetime at 1000 cd/m2 for Display and Lighting Applications," SID Digest '08 : SID International Symposium Digest of Technical Papers, vol. 39, May 20, 2008, pp. 822-825.

Kanno, H. et al., "High Efficiency Stacked Organic Light-Emitting Diodes Employing Li2O as a Connecting Layer," Japanese Journal of Applied Physics, vol. 45, No. 12, Dec. 7, 2006, pp. 9219-9223.

Nowatari, H. et al., "60.2: Intermediate Connector With Suppressed Voltage Loss for White Tandem OLEDs," SID Digest '09 : SID International Symposium Digest of Technical Papers, vol. 40, May 31, 2009, pp. 899-902.

Chang, C.-C. et al., "Highly Efficient White Organic Electroluminescent Devices Based on Tandem Architecture," Applied Physics Letters, vol. 87, No. 25, Dec. 12, 2005, pp. 253501-1-253501-3.

Kanno, H. et al., "White Stacked Electrophosphorescent Organic Light-Emitting Devices Employing MoO3 as a Charge-Generation Layer," Advanced Materials, vol. 18, No. 3, 2006, pp. 339-342.

Terai, M. et al., "Electric-Field-Assisted Bipolar Charge Generation From Internal Charge Separation Zone Composed of Doped Organic Bilayer," Applied Physics Letters, vol. 90, Feb. 21, 2007, pp. 083502-1-083502-3.

Law, C.W. et al., "Effective Organic-Based Connection Unit for Stacked Organic Light-Emitting Devices," Applied Physics Letters, vol. 89, No. 13, Sep. 28, 2006, pp. 133511-1-133511-3.

Leem, D.-S. et al., "Highly Efficient Tandem p-i-n Organic Light-Emitting Diodes Adopting a Low Temperature Evaporated Rhenium Oxide Interconnecting Layer," Applied Physics Letters, vol. 93, No. 10, Sep. 8, 2008, pp. 103304-1-103304-3.

Lai, S.L. et al., "Copper Hexadecafluorophthalocyanine and Copper Phthalocyanine as a Pure Organic Connecting Unit in Blue Tandem Organic Light-Emitting Devices," Journal of Applied Physics, vol. 101, 2007, pp. 014509-1-014509-4.

Liao, L.S. et al., "Power Efficiency Improvement in a Tandem Organic Light-Emitting Diode," Applied Physics Letters, vol. 92, No. 22, Jun. 2, 2008, pp. 223311-1-223311-3.

Chan, M-Y. et al., "Influences of Connecting Unit Architecture on the Performance of Tandem Organic Light-Emitting Devices," Advanced Functional Materials, vol. 17, No. 14, 2007, pp. 2509-2514.

Hiramoto, M. et al., "p-i-n Like Behavior in Three-Layered Organic Solar Cells Having a Co-Deposited Interlayer of Pigments," Journal of Applied Physics, vol. 72, No. 8, Oct. 15, 1992, pp. 3781-3787.

Brabec, C.J. et al., "Photovoltaic Properties of Conjugated Polymer/methanofullerene Composites Embedded in a Polystyrene Matrix," Journal of Applied Physics, vol. 85, No. 9, May 1, 1999, pp. 6866-6872.

Matsumoto, T. et al., "27.5L: Late-News Paper: Multiphoton Organic EL Device Having Charge Generation Layer," SID Digest '03 : SID International Symposium Digest of Technical Papers, vol. 34, 2003, pp. 979-981.

European Search Report re Application No. EP 11155565.2, dated Jan. 28, 2013.

Tanaka, H. et al., "High Efficiency Polarization-Sensitive Organic Photovoltaic Devices," Applied Physics Letters, 2006, vol. 88, No. 25, pp. 253506-1-253506-3.

Tanaka, H. et al., "Polarization-Sensitive Photodiodes Composed of Organic Multilayer Thin Films," Japanese Journal of Applied Physics, 2005, vol. 44, No. 12, pp. 8676-8678.

Chinese Office Action re Application No. CN 201110065985.2, dated Dec. 17, 2014.

* cited by examiner

LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to a light-emitting element including an electroluminescence (also referred to as EL) layer (the element also refereed to as an EL element), a light-emitting device including the light-emitting element, and an electronic device and a lighting device each including the light-emitting device.

2. Description of the Related Art

An EL element includes a pair of electrodes and an EL layer provided therebetween. A voltage is applied to the pair of electrodes, so that light is emitted from the EL layer. The EL layer contains an organic compound.

The light emission mechanism of EL elements will be described. Upon applying voltage to a pair of electrodes, electrons injected from a cathode and holes injected from an anode recombine in a light-emission center of an EL layer. As a result of the recombination, energy is released, so that light is emitted. Light emission is classified into emission from a singlet excited state and emission from a triplet excited state.

Light-emitting elements have various problems, one of which is how to reduce driving voltage.

According to Patent Document 1, an organic compound included in an electron-injection layer in contact with a cathode is doped with a metal having a low work function such as an alkali metal, an alkaline earth metal, or a rare-earth metal. Such a doping with the metal having a low work function lowers the barrier against electron injection from the cathode to the electron injection layer, thereby reducing driving voltage.

According to Patent Document 2, optical adjustment of an emission spectrum can be performed without increasing driving voltage. Specifically, between a cathode and an EL layer in a light-emitting element, a layer in which an organic compound having a hole-transport property is doped with a mental oxide is provided in contact with the cathode. Further, so as to be in contact with the metal oxide-doped layer, a layer in which an organic compound having an electron-transport property is doped with a metal having a low work function such as an alkali metal, an alkaline earth metal, or a rare earth metal is provided. The thickness of the metal oxide-doped layer is adjusted so that an increase in driving voltage is suppressed and optical adjustment of emission is performed.

REFERENCES

Patent Document 1: Japanese Published Patent Application No. H10-270171
Patent Document 2: Japanese Published Patent Application No. 2005-209643

SUMMARY OF THE INVENTION

According to Patent Document 2, the layer in which the organic compound having a hole-transport property is doped with the mental oxide is in contact with the layer in which the organic compound having an electron-transport property is doped with the metal having a low work function such as an alkali metal, an alkaline earth metal, or a rare earth metal. The organic compound having a hole-transport property is a donor substance, and the metal oxide is an acceptor substance. The metal having a low work function is a donor substance, and the organic compound having an electron-transport property is an acceptor substance. Therefore, the layer doped with the acceptor substance is in contact with the layer doped with the donor substance.

When the layer doped with the acceptor substance is in contact with the layer doped with the donor substance, a pn junction is formed to form a depletion layer. Further, the acceptor substance interacts with the donor substance, so that the function of the acceptor substance and the function of the donor substance are blocked. Accordingly, an increase in driving voltage is caused.

An object of one embodiment of the present invention is to provide a light-emitting element in which an increase in driving voltage can be suppressed. Another object is to provide a light-emitting device which has reduced power consumption by including the light-emitting element.

An object of one embodiment of the present invention is to suppress an increase in driving voltage in a light-emitting element including a layer including an acceptor substance and a layer including a donor substance. Another object is to provide a light-emitting device that has reduced power consumption by including the light-emitting element.

A light-emitting element according to a first embodiment of the present invention includes an EL layer between an anode and a cathode, and includes a first layer, a second layer, and a third layer between the cathode and the EL layer. The first layer is provided between the cathode and the second layer and in contact with the cathode and with the second layer, and includes a substance having a hole-transport property. The second layer is provided between the first layer and the third layer and in contact with the first layer and with the third layer, and includes a metal complex having a metal-oxygen bond and an aromatic ligand. The third layer is provided between the second layer and the EL layer and in contact with the second layer and with the EL layer, and includes an alkali metal, an alkaline-earth metal, a rare-earth metal, an alkali metal compound, an alkaline-earth metal compound, or a rare-earth metal compound. Since the metal complex included in the second layer has the metal-oxygen bond, electron transport from the first layer and electron transport to the third layer are facilitated.

A light-emitting element according to a second embodiment of the present invention includes an EL layer between an anode and a cathode, and includes a first layer, a second layer, and a third layer between the cathode and the EL layer. The first layer is provided between the cathode and the second layer and in contact with the cathode and with the second layer, and includes a substance having a hole-transport property and an acceptor substance with respect to the substance having a hole-transport property. The second layer is provided between the first layer and the third layer and in contact with the first layer and with the third layer, and includes a metal complex having a metal-oxygen bond and an aromatic ligand. The third layer is provided between the second layer and the EL layer and in contact with the second layer and with the EL layer, and includes an alkali metal, an alkaline-earth metal, a rare-earth metal, an alkali metal compound, an alkaline-earth metal compound, or a rare-earth metal compound. Since the metal complex included in the second layer has the metal-oxygen bond, electron transport from the first layer and electron transport to the third layer are facilitated.

In a preferable example of the light-emitting element according to the first or second embodiment of the present invention, the metal complex has a metal-oxygen double bond. This is because it is considered that the metal-oxygen double bond has a high acceptor property (i.e., easily receives electrons) and that the metal complex having the metal-oxygen double bond is stable.

The metal complex having the metal-oxygen bond and the aromatic ligand is a substance having an electron-transport property with a LUMO level (preferably, greater than or equal to −5.0 eV, more preferably greater than or equal to −5.0 eV and less than or equal to −3.0 eV) which is higher than the acceptor level of the acceptor substance included in the first layer. Therefore electron transport from the first layer to the second layer is facilitated. Accordingly, with the second layer, an increase in the driving voltage of the light-emitting element can be suppressed. The metal complex is preferably a phthalocyanine-based material.

The first layer includes an acceptor substance and a donor substance, and the third layer includes at least a donor substance. However, since the second layer is provided between the first layer and the third layer, it is possible to prevent formation of a pn junction and formation of a depletion layer. Further, it is also possible to prevent interaction between the layer including the acceptor substance and the layer including the donor substance.

Structural formulae of metal complexes that can be included in the second layer are illustrated below. Each metal complex has a metal-oxygen bond in which the central metal (V, Sn, or Ti) is bonded to an oxygen atom. This further facilitates electron transport, and, even if the thickness of the second layer is large (e.g., greater than or equal to 10 nm and less than or equal to 15 nm), an increase in the driving voltage of the light-emitting element can be suppressed.

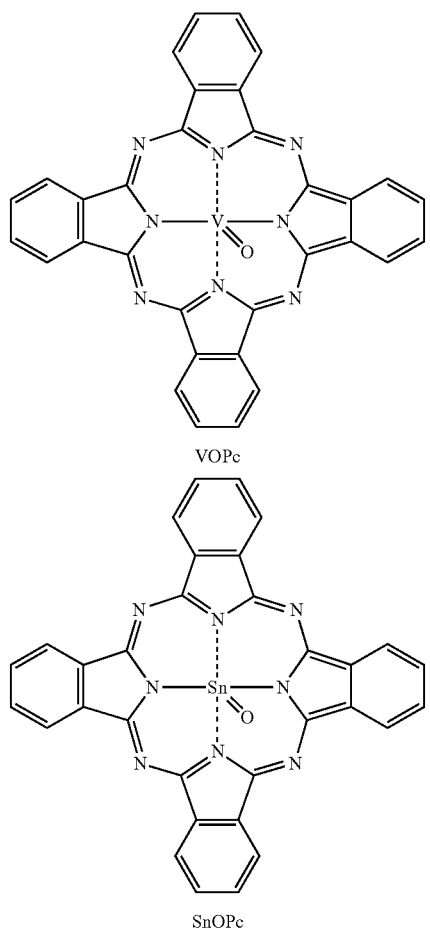

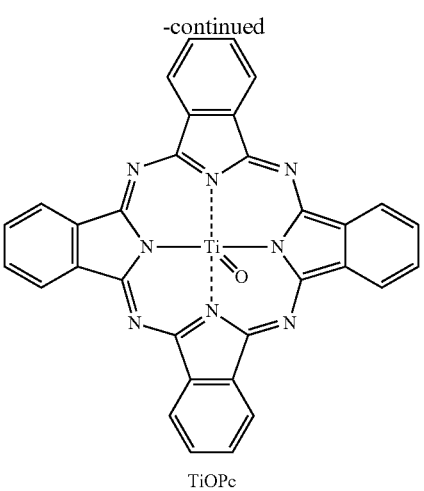

In a preferable example of the light-emitting element according to the first or second embodiment of the present invention, the second layer includes an alkali metal, an alkaline-earth metal, a rare-earth metal, an alkali metal compound, an alkaline-earth metal compound, or a rare-earth metal compound. The metal or compound serves as a donor substance in the second layer, and a donor level is formed. The donor level affects the LUMO level of the second layer, and electrons can easily move from the acceptor level of the first layer to the LUMO level of the second layer. Thus, electrons can be easily injected into the EL layer, and an increase in the driving voltage of the light-emitting element can be suppressed.

In the second layer, the metal or compound may be added so that the mass ratio thereof to the metal complex is greater than or equal to 0.001:1 and less than or equal to 0.1:1 to enhance the above effect.

In a preferable example of the light-emitting element according to the first or second embodiment of the present invention, the third layer includes a substance having an electron-transport property. The third layer reduces an injection barrier against electron injection into the EL layer. By including the substance having an electron-transport property as well, electrons can be efficiently transported in the third layer.

In the third layer, an alkali metal, an alkaline-earth metal, a rare-earth metal, an alkali metal compound, an alkaline-earth metal compound, or a rare-earth metal compound may be added so that the mass ratio thereof to the substance having an electron-transport property is greater than or equal to 0.001:1 and less than or equal to 0.1:1 to enhance the above effect.

In a preferable example of the light-emitting element according to the first or second embodiment of the present invention, the EL layer includes a fourth layer including a substance having an electron-transport property and the fourth layer is in contact with the third layer. Accordingly, the above effect can be enhanced.

In a preferable example of the light-emitting element according to the first or second embodiment of the present invention, the first layer includes the acceptor substance so that the mass ratio of the acceptor substance to the substance having a hole-transport property is greater than or equal to 0.1:1 and less than or equal to 4.0:1. The first layer serves as a charge generation region, and charges can be efficiently generated in the above case. Furthermore, the first layer shows little variation in its conductivity even with its thickness increased, and this effect is enhanced in the above case. Because of the little variation in the conductivity of the first layer, adjustment of its thickness enables optical adjustment of light emission without increasing in driving voltage, and this effect is enhanced in this case.

In a preferable example of the light-emitting element according to the second embodiment of the present invention, the first layer has a stack structure of a layer including the substance having a hole-transport property and a layer including the acceptor substance. A charge-transfer complex is formed in the first layer, and charges are generated by the charge-transfer complex. Further, the charge-transfer complex has absorption in the visible region. In the above case, because the charge-transfer complex is formed only at an interface, light emission from the EL layer becomes difficult to absorb in the charge-transfer complex.

In a preferable example of the light-emitting element according to the first or second embodiment of the present invention, the EL layer includes a fifth layer including a substance having a hole-transport property and an acceptor substance with respect to the substance having a hole-transport property, and the fifth layer is in contact with the anode. The fifth layer serves as a charge generation region like the first layer. By providing the charge generation regions on the cathode side and the abode side, carrier balance can be improved. Further, when a layer in contact with the cathode and a layer in contact with the anode have the same structures, the balance of stress can be improved.

The fifth layer may include the acceptor substance so that the mass ratio of the acceptor substance to the substance having a hole-transport property is greater than or equal to 0.1:1 and less than or equal to 4.0:1. In the above case, charges can be efficiently generated. Furthermore, the fifth layer shows little variation in its conductivity even with its thickness increased, and this effect is enhanced in the above case. Because of the little variation in the conductivity of the fifth layer, adjustment of its thickness enables optical adjustment of light emission without increasing in driving voltage, and this effect is enhanced in this case.

The fifth layer may have a stack structure of a layer including the substance having a hole-transport property and a layer including the acceptor substance. A charge-transfer complex is formed in the fifth layer, and charges are generated by the charge-transfer complex. Further, the charge-transfer complex has absorption in the visible region. In the above case, because the charge-transfer complex is formed only at an interface, light emission from the EL layer becomes difficult to absorb in the charge-transfer complex.

In a preferable example of the light-emitting element according to the second embodiment of the present invention, the acceptor substance included in the first layer is an oxide of a metal belonging to Group 4 to Group 8 in the periodic table. This is because the function as a charge generation region is enhanced in the above case.

In a preferable example of the light-emitting element according to the second embodiment of the present invention, the acceptor substance included in the first layer is molybdenum oxide. This is because, in the above case, an effect brought about by the charge generation region is enhanced and the hygroscopic property is low.

A light-emitting device may be formed using the above light-emitting element, and an electronic device or a lighting device may be formed using the light-emitting device. Accordingly, a light-emitting device, an electronic device, and a lighting device each having reduced power consumption can be provided.

The light-emitting device in this specification refers to an image display device, a light-emitting device, or a light source (including a lighting device). In addition, the light-emitting device include all of the following modules in its category: a module in which a connector, for example, an FPC (flexible printed circuit), a TAB (tape automated bonding) tape, or a TCP (tape carrier package) is attached to a light-emitting device; a module provided with a printed wiring board at the end of a TAB tape or a TCP; and a module in which an integrated circuit (IC) is directly mounted on a light-emitting element by a COG (chip-on-glass) method.

In the light-emitting element according to the first embodiment of the present invention, an increase in driving voltage can be suppressed by the second layer. Since the metal complex included in the second layer has the metal-oxygen bond, electron transport from the first layer and electron transport to the third layer are facilitated.

Since the second layer is provided between the first layer and the third layer, it is possible to prevent formation of a pn junction and formation of a depletion layer. Further, it is also possible to prevent interaction between the first layer and the third layer.

DETAILED DESCRIPTION OF THE INVENTION

Embodiments of the present invention will now be described with reference to the accompanying drawings. Note that the invention is not limited to the description below, and various changes and modifications can be made without departing from the spirit and scope of the invention. Therefore, the invention should not be construed as being limited to the description in the following Embodiments.

Embodiment 1

An element structure of a light-emitting element which is one embodiment of the present invention will be described with reference to FIGS. 1A and 1B and FIG. 2.

Figure 1A:
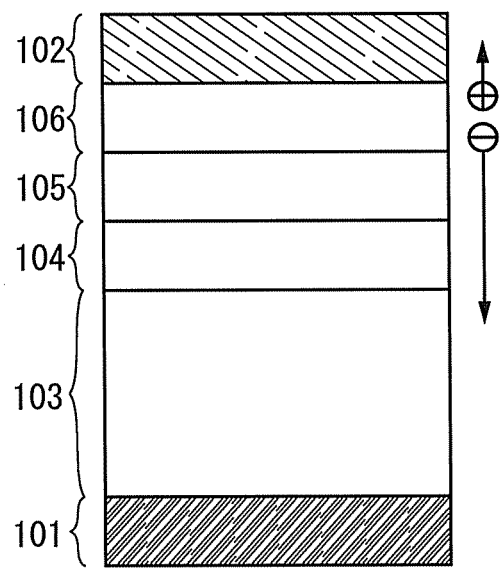
FIG. 1A illustrates an element structure of a light-emitting element and FIG. 1B is a band diagram thereof.
Figure 2:
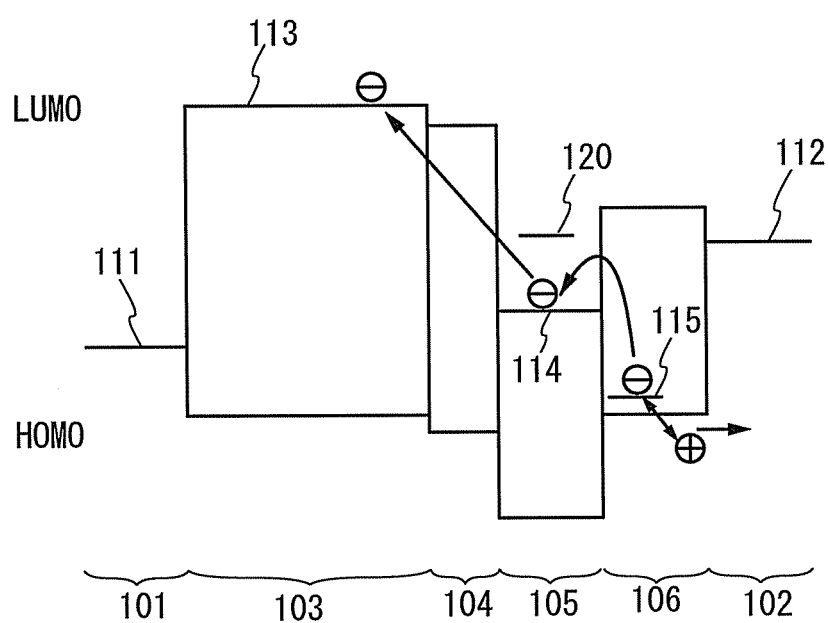
FIG. 2 is a band diagram of a light-emitting element.

The light-emitting element illustrated in FIG. 1A has an EL layer 103 including a light-emitting region between a pair of electrodes (an anode 101 and a cathode 102). Between the cathode 102 and the EL layer 103, the element has a first layer 106, a second layer 105, and a third layer 104 in order from the cathode 102 side.

The first layer 106 is between the cathode 102 and the second layer 105, and in contact with the cathode 102 and with the second layer 105. The first layer 106 includes a substance having a hole-transport property and an acceptor substance with respect to the substance having a hole-transport property and serves as a charge generation region. Holes and electrons are considered to be generated in such a manner that the substance having a hole-transport property and the acceptor substance form a charge-transfer complex and the acceptor substance draws electrons from the substance having a hole-transport property. The first layer 106 has a thickness greater than or equal to 10 nm and less than or equal to 200 nm. Because even an increase in the thickness of the first layer 106 causes little variation in its conductivity, an increase in the driving voltage of the light-emitting element can be suppressed. Adjustment of the thickness of the first layer 106 enables optical adjustment of light emission without involving an increase in the driving voltage.

The second layer 105 is between the first layer 106 and the third layer 104, and in contact with the first layer 106 and with the third layer 104. The second layer 105 includes a metal complex having a metal-oxygen bond and an aromatic ligand, and receives electrons generated in the first layer 106 and passes the electrons to the third layer 104; thus, the second layer 105 serves as an electron relay layer. The metal-oxygen bond further facilitates transport of electrons. The second layer 105 prevents interaction between the first layer 106 and the third layer 104. The second layer 105 can prevent formation of a pn junction and formation of a depletion layer.

The metal complex preferably has a metal-oxygen double bond. This is because it is considered that the metal-oxygen double bond has a high acceptor property (i.e., easily receives electrons) and that the metal complex having the metal-oxygen double bond is stable.

The metal complex is preferably a phthalocyanine-based material, and specifically a phthalocyanine-based material having a structure represented by any of the following formulae.

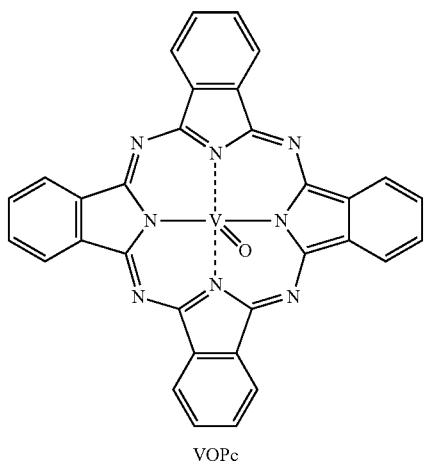

VOPc

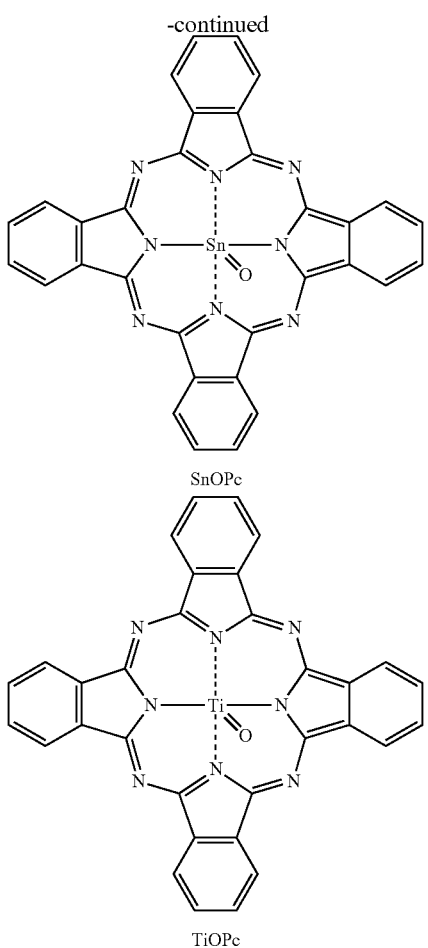

SnOPc

TiOPc

The third layer 104 is between the second layer 105 and the EL layer 103, and in contact with the second layer 105 and with the EL layer 103. The third layer 104 includes an alkali metal, an alkaline-earth metal, a rare-earth metal, an alkali metal compound, an alkaline-earth metal compound, or a rare-earth metal compound, and passes electrons received from the second layer 105 to the EL layer 103. The third layer serves as an electron-injection buffer layer.

In the first layer 106, holes and electrons which are carriers of the light-emitting element are generated, and the holes and electrons move to the cathode 102 and the second layer 105 respectively. The second layer 105 immediately transports the electrons to the third layer 104 because of the high electron-transport property of the second layer 105. The third layer 104 can reduce an injection barrier against electron injection into the EL layer 103. In this manner, the efficiency of the electron injection into the EL layer 103 can be raised. Hereinafter, descriptions will be given with reference to band diagrams.

Figure 1B:
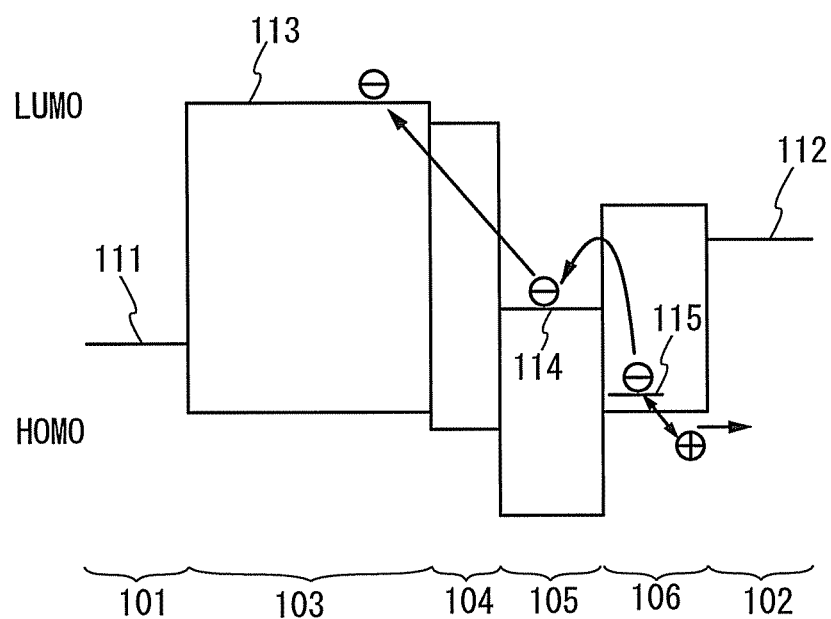

FIG. 1B is a band diagram of the element structure illustrated in FIG. 1A. In FIG. 1B, reference numeral 111 denotes the Fermi level of the anode 101; 112, the Fermi level of the cathode 102; 113, the LUMO (lowest unoccupied molecular orbital) level of the EL layer 103; 114, the LUMO level of the second layer 105; and 115, the acceptor level of the acceptor substance in the first layer 106.

In order that the second layer 105 can efficiently inject electrons generated in the first layer 106 into the EL layer 103, the LUMO level 114 of the second layer 105 occupies a level between the acceptor level 115 of the acceptor substance in the first layer 106 and the LUMO level 113 of the EL layer 103, and is specifically greater than or equal to −5.0 eV and less than or equal to −3.0 eV. Further, by the metal-oxygen bond included in the second layer, electron transport is further facilitated. The second layer 105 prevents interaction between the first layer 106 and the third layer 104 and prevents formation of a pn junction and formation of a depletion layer, thereby suppressing an increase in the driving voltage of the light-emitting element.

Since the injection barrier is reduced by the third layer 104, electrons that move from the acceptor level 115 of the first layer 106 to the LUMO level 114 of the second layer 105 are easily injected into the LUMO level 113 of the EL layer 103. The electrons recombine with holes injected from the anode 101, and the EL layer 103 emits light. Holes generated in the first layer 106 move to the cathode 102.

Although the second layer 105 includes the metal complex having the metal-oxygen bond and the aromatic ligand as described above, the second layer 105 may further include an alkali metal, an alkaline-earth metal, a rare-earth metal, an alkali metal compound, an alkaline-earth metal compound, or a rare-earth metal compound. The metal or metal compound serves as a donor substance for the metal complex. A band diagram illustrating this case is FIG. 2. Reference numeral 120 denotes the donor level of the donor substance in the second layer 105. The donor level 120 occupies a level between the acceptor level 115 of the acceptor substance in the first layer 106 and the LUMO level 113 of the EL layer 103, and is specifically greater than or equal to −5.0 eV and less than or equal to −3.0 eV.

The donor level 120 affects the LUMO level 114 of the second layer 105. Electrons can easily move from the acceptor level 115 of the first layer 106 to the LUMO level 114 of the second layer 105. The electrons that move to the LUMO level 114 of the second layer 105 are easily injected into the LUMO level 113 of the EL layer 103, since the injection barrier is reduced by the third layer 104. Thus, in the case where the second layer 105 includes the metal or metal compound, electrons can be further easily injected into the EL layer 103, so that an increase in the driving voltage of the light-emitting element can be suppressed.

Materials and the like used for the first layer 106, the second layer 105, and the third layer 104 will be described below.

The first layer 106 includes the substance having a hole-transport property and the acceptor substance and serves as a charge generation region. The substance having a hole-transport property can be any of a variety of organic compounds such as aromatic amine compounds, carbazole derivatives, aromatic hydrocarbons, and high molecular compounds (e.g., oligomers, dendrimers, and polymers), and is preferably a substance having a hole mobility of $10^{-6}$ cm$^2$/Vs or more, specifically. Note that other than these substances, any substance that has a property of transporting more holes than electrons may be used.

Specific examples of the aromatic amine compounds are 4,4'-bis[N-(1-naphthyl)-N-phenylamino]biphenyl (abbreviation: NPB or α-NPD), N,N'-bis(3-methylphenyl)-N,N'-diphenyl-[1',1'-biphenyl]-4,4'-diamine (abbreviation: TPD), 4,4',4"-tris(carbazol-9-yl)triphenylamine (abbreviation: TCTA) 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 1,3,5-tris[N-(4-diphenylaminophenyl)-N-phenylamino]benzene (abbreviation: DPA3B), and the like.

Specific examples of the carbazole derivatives are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Other examples are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Specific examples of the aromatic hydrocarbons are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples thereof are pentacene, coronene, and the like. An aromatic hydrocarbon that thus has a hole mobility of $1\times10^{-6}$ cm$^2$/Vs or more and has 14 to 42 carbon atoms is preferably used.

The aromatic hydrocarbons may each have a vinyl skeleton. Examples of the aromatic hydrocarbons having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other applicable examples are high molecular compounds such as poly(N-vinylcarbazole) (abbreviation: PVK) and poly(4-vinyltriphenylamine) (abbreviation: PVTPA).

Examples of the acceptor substance used for the first layer 106 are oxides of transition metals and oxides of metals that belong to Group 4 to Group 8 in the periodic table. Specific preferred examples include vanadium oxide, niobium oxide, tantalum oxide, chromium oxide, molybdenum oxide, tungsten oxide, manganese oxide, and rhenium oxide because of their high electron-acceptor properties, among which a particularly preferred one is molybdenum oxide because of its low hygroscopic property. Other examples include 7,7,8,8-tetracyano-2,3,5,6-tetrafluoroquinodimethane (abbreviation: $F_4$-TCNQ) and chloranil.

In the first layer 106, the acceptor substance is preferably added so that the mass ratio thereof to the substance having a hole-transport property is greater than or equal to 0.1:1 and less than or equal to 4.0:1.

The first layer 106 is not limited to containing the substance having a hole-transport property and the acceptor substance in the same film, and can be a stack of a layer including the substance having a hole-transport property and a layer including the acceptor substance. Note that in the case of the stack structure, the layer including the substance having a hole-transport property is in contact with the cathode 102.

The first layer 106 has a thickness greater than or equal to 10 nm and less than or equal to 200 nm. Because even an increase in the thickness of the first layer 106 causes little variation in its conductivity, an increase in the driving voltage of the light-emitting element can be suppressed. Adjustment of the thickness of the first layer 106 enables optical adjustment of light emission without involving an increase in the driving voltage.

The second layer 105 immediately receives electrons drawn by the acceptor substance in the first layer 106. The second layer 105 includes the metal complex having the metal-oxygen bond and the aromatic ligand. The LUMO level of the second layer 105 occupies a level between the acceptor level of the acceptor substance in the first layer 106 and the LUMO level of the EL layer 103. Specific preferred examples include greater than or equal to −5.0 eV and less than or equal to −3.0 eV. Further, since the metal complex has the metal-oxygen bond, electron transport is further facilitated. The metal complex is preferably a phthalocyanine-based compound, and specifically any of VOPc, SnOPc, and TiOPc.

In the second layer 105, the donor substance may be added so that the mass ratio thereof to the metal complex is greater than or equal to 0.001:1 and less than or equal to 0.1:1. Examples of the donor substance include organic compounds such as tetrathianaphthacene (abbreviation: TTN), nickelocene, and decamethylnickelocene, other than alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

The second layer 105 has a thickness greater than or equal to 1 nm and less than or equal to 15 nm, preferably greater than or equal to 1 nm and less than or equal to 10 nm. Since the metal complex has the metal-oxygen bond, the second layer 105 may have a thickness greater than or equal to 10 nm and less than or equal to 15 nm. The second layer 105 prevents interaction between the first layer 106 and the third layer 104 and prevents formation of a pn junction and formation of a depletion layer, thereby suppressing an increase in the driving voltage of the light-emitting element. By the addition of the donor substance, electron injection into the EL layer 103 can be further facilitated, so that an increase in the driving voltage of the light-emitting element can be suppressed.

The third layer 104 injects electrons received by the second layer 105 into the EL layer 103. For the third layer 104, any of the following substances having a high electron-injection property is used: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

In the case where the third layer 104 also includes a substance having an electron-transport property, the substance having a high electron-injection property is preferably added so that the mass ratio thereof to the substance having an electron-transport property is greater than or equal to 0.001:1 and less than or equal to 0.1:1.

Examples of the substance having an electron-transport property which can be used are: metal complexes having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq); metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$); and the like. Examples other than the metal complexes are 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-biphenylyl)-1,2,4-triazole (abbreviation: TAZ), bathophenanthroline (abbreviation: BPhen), bathocuproine (abbreviation: BCP), and the like. The substances described here are mainly substances having an electron mobility of $10^{-6}$ cm$^2$/Vs or more. Note that other than the above substances, any substance that has a property of transporting more electrons than holes may be used. Furthermore, the electron-transport layer is not limited to a single layer, and may be a stack of two or more layers containing any of the above substances. Other examples are high molecular compounds such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy).

The third layer 104 has a thickness greater than or equal to 0.1 nm and less than or equal to 10 nm. Since the third layer 104 can reduce the injection barrier between the first layer 106 and the EL layer 103, electrons generated in the first layer 106 can be easily injected into the EL layer 103.

The first layer 106, the second layer 105, and the third layer 104 can be formed by any of a variety of methods such as dry processes (e.g., a vacuum evaporation method) and wet processes (e.g., an inkjet method and a spin coating method).

Next, other structures in the light-emitting element will be described.

For the anode 101, any of metals, alloys, electrically conductive compounds, mixtures thereof, and the like which has a high work function (specifically, a work function of 4.0 eV or more) is preferably used. Specific examples thereof include indium oxide-tin oxide (ITO: indium tin oxide), indium tin oxide containing silicon or silicon oxide, indium oxide-zinc oxide (IZO: indium zinc oxide), indium oxide containing tungsten oxide and zinc oxide, and the like.

Although the anode 101 is generally formed by sputtering, it may be formed by applying a sol-gel method or the like. For example, a film of indium oxide-zinc oxide (IZO) can be formed by a sputtering method using a target obtained by adding 1 wt % to 20 wt % of zinc oxide to indium oxide. A film of indium oxide containing tungsten oxide and zinc oxide can be formed by a sputtering method using a target obtained by adding 0.5 wt % to 5 wt % of tungsten oxide and 0.1 wt % to 1 wt % of zinc oxide to indium oxide.

For the anode 101, any of the following substances may be used: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide; conductive polymers such as poly(3,4-ethylenedioxythiophene)/poly(styrenesulfonic acid) (PEDOT/PSS) and polyaniline/poly(styrenesulfonic acid) (PAni/PSS); and the like. Note that, in the case where the fifth layer described below is provided in contact with the anode 101, any of a variety of conductive materials such as Al and Ag can be used for the anode 101 regardless of the work function.

For the cathode 102, any of metals, alloys, electrically conductive compounds, mixtures thereof, and the like, which has a low work function (preferably, a work function of 3.8 eV or less) can be used, and examples thereof are elements that belong to Group 1 or Group 2 in the periodic table, that is, alkali metals such as lithium (Li) and cesium (Cs) and alkaline-earth metals such as magnesium (Mg), calcium (Ca), and strontium (Sr), alloys thereof (e.g., Mg—Ag and Al—Li), rare-earth metals such as europium (Eu) and ytterbium (Yb), alloys thereof, and the like. Note that a film of any of the alkali metals, alkaline-earth metals, and alloys thereof can be formed by a vacuum evaporation method. A film of any of the alloys containing the alkali metals or alkaline-earth metals may be formed by a sputtering method. Furthermore, a film of a silver paste or the like can be formed by an inkjet method or the like.

Other than the above, the cathode 102 can also be formed with a stack of a thin film of an alkali metal compound, an alkaline-earth metal compound, or a rare-earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. In the case where the first layer 106 serving as a charge generation region is provided in contact with the cathode 102 as in the structure of this embodiment, any of a variety of conductive materials such as Al, Ag, ITO, and indium oxide-tin oxide containing silicon or silicon oxide can be used for the cathode 102 regardless of the work function.

Note that in the light-emitting element described in this embodiment, at least one of the anode and the cathode has a property of transmitting visible light. The light-transmitting property can be obtained with use of a light-transmitting electrode such as ITO, or a reduction in the thickness of an electrode.

The EL layer 103 includes at least a light-emitting layer, and may also have a stack structure of layers other than the light-emitting layer. Examples of the layers other than the light-emitting layer are layers including any of a substance having a hole-injection property, a substance having a hole-transport property, a substance having an electron-transport property, a substance having an electron-injection property, a substance having a bipolar property (a substance having a high electron-transport property and a high hole-transport property), and the like, and specifically, a hole-injection layer, a hole-transport layer, a light-emitting layer, a hole-blocking layer, an electron-transport layer (the fourth layer), an electron-injection layer, and the like. These layers can be combined as appropriate. Furthermore, in the EL layer 103, a charge generation region (the fifth layer) can be provided in contact with the anode 101.

Specific examples of the materials for the layers in the above EL layer 103 will be described below.

The hole-injection layer is a layer including a substance having a hole-injection property. As the substance having a hole-injection property, for example, molybdenum oxide, vanadium oxide, ruthenium oxide, tungsten oxide, or manganese oxide can be used. Other than these, any of the following can be used to form the hole-injection layer: phthalocyanine-based compounds such as phthalocyanine (abbreviation: $H_2Pc$) and copper phthalocyanine (abbreviation: CuPc), high molecules such as poly(3,4-ethylenedioxythiophene)/poly(styrenesulfonic acid) (PEDOT/PSS), and the like.

The hole-transport layer is a layer including a substance having a hole-transport property. Examples of the substance having a hole-transport property are: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA); and the like. The substances mentioned here are mainly substances that have a hole mobility of $10^{-6}$ $cm^2/Vs$ or more. Note that other than the above substances, any substance that has a property of transporting more holes than electrons may be used. Further, the layer including the substance having a hole-transport property is not limited to a single layer, and may be a stack of two or more layers containing any of the above substances.

Other examples of the substance that can be used for the hole-transport layer are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacryla mide] (abbreviation: PTPDMA), and poly[N,N'-bis(4-butylphenyl)-N,N'-bis(phenyl)benzidine] (abbreviation: Poly-TPD).

The light-emitting layer is a layer including a light-emitting substance. Examples of the fluorescent compounds that can be used as the light-emitting substance are N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N', N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: Bis DCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

Examples of the phosphorescent compounds that can be used as the light-emitting substance are bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III) picolinate (abbreviation: Ir(CF$_3$ppy)$_2$(pic)), bis[2-(4',6'-difluorophenyl)pyridinato-N,$C^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), bis[2-(2'-benzo[4,5-α]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that such a light-emitting substance is preferably dispersed in a host material. Examples of the host material are: aromatic amine compounds such as 4,4'-bis[N-(1-naphthyl)-N-phenylamino]biphenyl (abbreviation: NPB or α-NPD), N,N'-bis(3-methylphenyl)-N,N-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Other than the above, a substance having a high hole-transport property can be used, and examples thereof are carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA) and high molecular compounds such as poly[N-(4-{N'-[4-(4-diphenylamino)phenyl]phenyl-N'-phenylamino}phenyl)methacrylamide] (abbreviation: PTPDMA) and poly[N,N'-bis(4-butylphenyl)-N,N'-bis(phenyl)benzidine] (abbreviation: Poly-TPD). Other than the above, a substance having an electron-transport property can be used, and examples thereof are metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq); metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)-benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11); 3-(4-biphenylyl)-4-phenyl-5-(4-tert-biphenylyl)-1,2,4-triazole (abbreviation: TAZ); bathophenanthroline (abbreviation: BPhen); and bathocuproine (abbreviation: BCP).

The electron-transport layer is a layer including a substance having an electron-transport property. Examples of the substance having an electron-transport property which can be used are: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq); metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 9-[4-(5-phenyl-1,3,4-oxadiazol-2-yl)phenyl]-9H-carbazole (abbreviation: CO11); 3-(4-biphenylyl)-4-phenyl-5-(4-tert-butylphenyl)-1,2,4-triazole (abbreviation: TAZ); bathophenanthroline (abbreviation: BPhen); bathocuproine (abbreviation: BCP); and the like. The substances described here are mainly substances having an electron mobility of $10^{-6}$ cm$^2$/Vs or more. Note that other than the above substances, any substance that has a property of transporting more electrons than holes may be used. Further, the electron-transport layer is not limited to a single layer, and may be a stack of two or more layers containing any of the above substances are stacked.

Other examples of the substance that can be used for the electron-transport layer are high molecular compounds such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy).

The electron-injection layer is a layer including a substance having an electron-injection property. Examples of the substance having an electron-injection property are alkali metals, alkaline-earth metals, or a compound thereof such as lithium (Li), cesium (Cs), calcium (Ca), lithium fluoride (LiF), cesium fluoride (CsF), calcium fluoride (CaF$_2$). Furthermore, it is possible to use a layer including a substance having an electron-transport property in which any of alkali metals, alkaline-earth metals, and compounds thereof is added, for example, a layer including Alq in which magnesium (Mg) is added.

In the EL layer 103, the fifth layer can be provided as a charge generation region so as to be in contact with the anode 101, as described above. The charge generation region includes the substance having a hole-transport property and the acceptor substance with respect to the substance having a hole-transport property. The charge generation region is not limited to containing the substance having a hole-transport property and the acceptor substance in the same film, and may be a stack of a layer including the substance having a hole-transport property and a layer including the acceptor substance. Note that in the stack structure, the layer including the acceptor substance is in contact with the anode 101.

By forming the fifth layer, the anode 101 can be formed without consideration of the work function of a material for forming the anode 101. In other words, the material for forming the anode 101 is not limited to a material having a high work function, and a material having a low work function can also be used.

Examples of the acceptor substance used for the fifth layer are oxides of metals that belong to any of Group 4 to Group 8 in the periodic table. Specific preferred examples include vanadium oxide, niobium oxide, tantalum oxide, chromium oxide, molybdenum oxide, tungsten oxide, manganese oxide, and rhenium oxide because of their high electron-acceptor properties, among which a particularly preferred one is molybdenum oxide, which has a feature of a low hygroscopic property. Since moisture adversely affects an EL element, use of a material having a low hygroscopic property is preferable.

The substance having a hole-transport property used for the fifth layer can be any of a variety of organic compounds such as aromatic amine compounds, carbazole derivatives, aromatic hydrocarbons, and high molecular compounds (e.g., oligomers, dendrimers, and polymers), and is preferably a substance having a hole mobility of $10^{-6}$ cm$^2$/Vs or more, specifically. Note that other than these substances, any substance that has a property of transporting more holes than electrons may be used.

Note that such layers are stacked in appropriate combination, whereby the EL layer 103 can be formed. Further, as a formation method of the EL layer 103, any of a variety of methods (e.g., dry processes and wet processes) can be selected as appropriate depending on a material to be used. A vacuum evaporation method, an inkjet method, a spin coating method, or the like can be used. In addition, formation methods may differ for different layers.

The light-emitting element described in this embodiment can be fabricated by combination of the above-described materials. Although light emission from the above-described light-emitting substance can be obtained with this light-emitting element, a variety of emission colors can be obtained by changing the kind of the light-emitting substance. In addition, when light-emitting substances having different emission colors are used as the light-emitting substances, light emission having a broad spectrum or white light emission can also be obtained. Note that in order to obtain white light emission, a stack of layers which emit light whose colors are complementary or the like can be employed. Specific examples of the complementary colors are a combination of blue and yellow, a combination of blue-green and red, and the like.

Further, the light-emitting element described in this embodiment can be formed over any of a variety of substrates. As the substrate, for example, a substrate made of glass, plastic, a metal plate, metal foil, or the like can be used. In the case where light emission of the light-emitting element is extracted from the substrate side, a substrate having a light-transmitting property is used. Note that as the substrate, a substrate other than the above may be used as long as it can serve as a support in the fabrication process of the light-emitting element.

Note also that the element structure of the light-emitting element described in this embodiment can be applied to a passive matrix light-emitting device in which both electrodes are formed in a grid pattern over one substrate. However, in the case where the light-emitting device is used for a lighting device, there is no need to form the electrodes in a grid pattern. The element structure can also be applied to an active matrix light-emitting device including a light-emitting element which is electrically connected to a thin film transistor (TFT) functioning as a switch or the like and the driving of which is controlled by the TFT or the like. Note that there is no particular limitation on the structure of the TFT: a staggered TFT or an inverted staggered TFT may be employed; and a driver circuit formed with a TFT may be formed using an n-type TFT and a p-type TFT, or using either an n-type TFT or a p-type TFT. In addition, there is no particular limitation on the crystallinity of a semiconductor film used for the TFT, and any of the following can be used: amorphous semiconductor films, crystalline semiconductor films, single crystalline semiconductor films, which can be formed by a Smart Cut (registered trademark) method or the like, and oxide semiconductors, for example, an oxide semiconductor containing indium, gallium, and zinc.

With an element structure described in this embodiment, the driving voltage of an EL element can be reduced. Since the second layer 105 has the metal-oxygen bond, even if its thickness is large, an increase in the driving voltage of the EL element can be suppressed. Further, since the second layer 105 is provided between the first layer 106 and the third layer 104, it is possible to prevent interaction between the first layer 106 and the third layer 104 and prevent formation of a pn junction and formation of a depletion layer, whereby an increase in the driving voltage of the EL element can be suppressed.

Embodiment 2

In this embodiment, an example of the light-emitting element described in Embodiment 1 will be described with reference to FIGS. 3A and 3B.

Figure 3A:
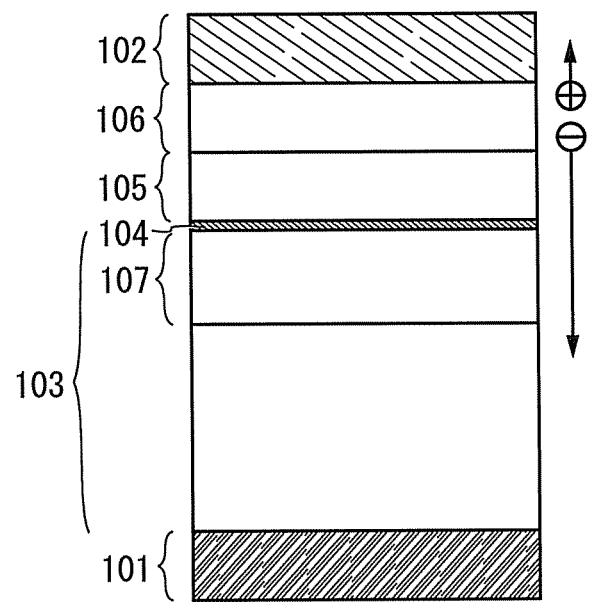
FIG. 3A illustrates an element structure of a light-emitting element and FIG. 3B is a band diagram thereof.

As illustrated in FIG. 3A, in the light-emitting element, the EL layer 103 including a light-emitting region is interposed between the pair of electrodes (the anode 101 and the cathode 102). Between the cathode 102 and the EL layer 103, the first layer 106 serving as a charge generation region, the second layer 105 serving as an electron-relay layer, and the third layer 104 serving as an electron-injection buffer are sequentially stacked over the cathode 102.

The same materials as described in Embodiment 1 can be used for the anode 101, the cathode 102, the EL layer 103, the first layer 106, and the second layer 105.

As a substance used for the third layer 104, the following substances having a high electron-injection property can be given as examples: alkali metals such as lithium (Li) and cesium (Cs), alkaline-earth metals such as magnesium (Mg), calcium (Ca), and strontium (Sr), rare-earth metals such as europium (Eu) and ytterbium (Yb), alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

After the EL layer 103 is formed over the anode 101, the third layer 104, the second layer 105, and the first layer 106 are sequentially formed thereover. The thickness of the third layer 104 is extremely small (specifically, greater than or equal to 0.1 nm and less than or equal to 1 mm) in order to avoid an increase in driving voltage. The third layer 104 is proximately located at the interface between the second layer 105 and the fourth layer 107 serving as an electron-transport layer which is included in the EL layer 103. However, if the third layer 104 is formed over the fourth layer 107 after formation of the fourth layer 107, part of a substance forming the third layer 104 can exist also in the fourth layer 107.

Figure 3B:
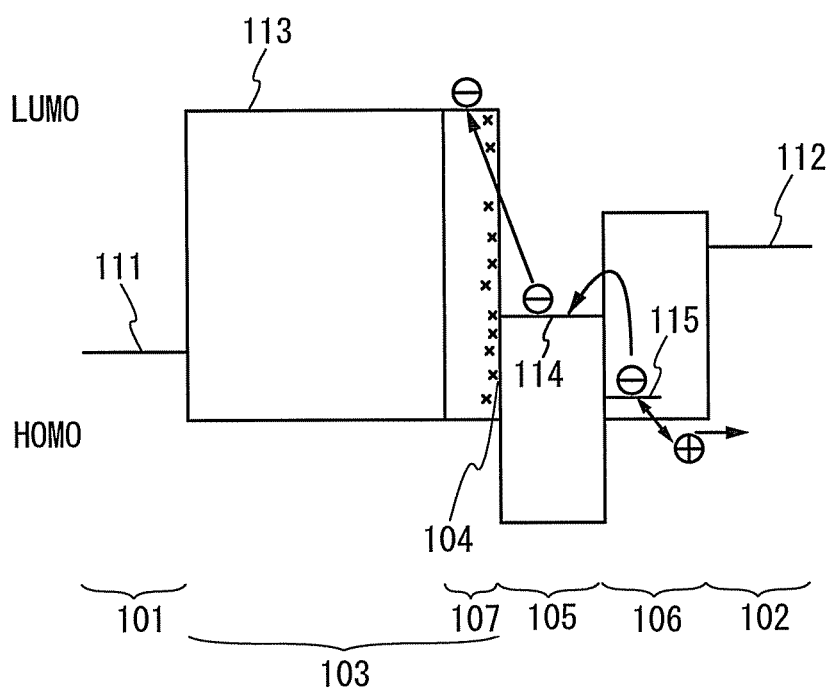

FIG. 3B is a band diagram in the case where the element illustrated in FIG. 3A is fabricated by sequentially stacking layers from the anode 101 side. The symbol x denotes a substance included in the third layer 104. Since the third layer 104 is very thin, the substance included in the third layer 104 can exist also in the fourth layer 107.

By providing the third layer 104 at the interface between the second layer 105 and the EL layer 103, an injection barrier can be reduced. Accordingly, electrons generated in the first layer 106 can be easily injected from the second layer 105 into the EL layer 103. In addition, holes generated in the first layer 106 move to the cathode.

As described in this embodiment, when the third layer 104 is formed with the above substance to a thickness greater than or equal to 0.1 nm and less than or equal to 1 nm so as to be in contact with the fourth layer, the driving voltage of the light-emitting element can be more reduced than when the third layer 104 is formed by the addition of the substance having an electron-transport property as described in Embodiment 1.

Among the above-described substances having an electron-injection property used for the third layer 104, the following ones are stable in the air and therefore suitable for mass production: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

The structure described in Embodiment 2 can be combined with a structure described in Embodiment 1 as appropriate.

For example, in the second layer 105, the donor substance may be added so that the mass ratio thereof to the metal complex is greater than or equal to 0.001:1 and less than or equal to 0.1:1, as described in Embodiment 1. As the donor substance, a substance given in Embodiment 1 is used.

Embodiment 3

In this embodiment, an example of the light-emitting element described in Embodiment 1 will be described with reference to FIGS. 4A and 4B.

Figure 4A:
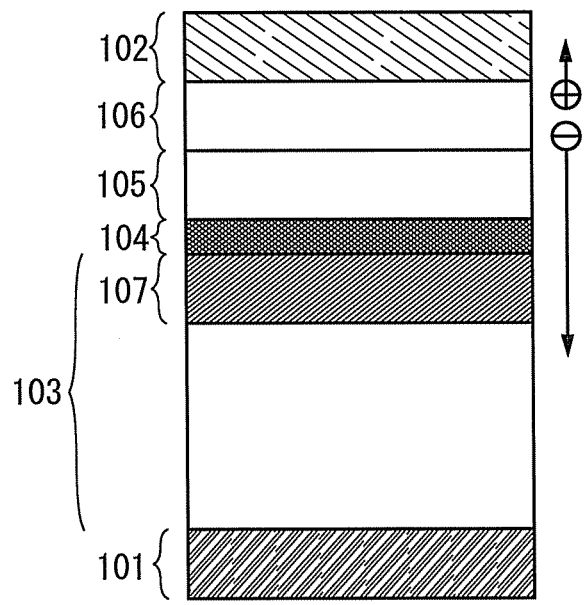
FIG. 4A illustrates an element structure of a light-emitting element and FIG. 4B is a band diagram thereof.
Figure 4B:
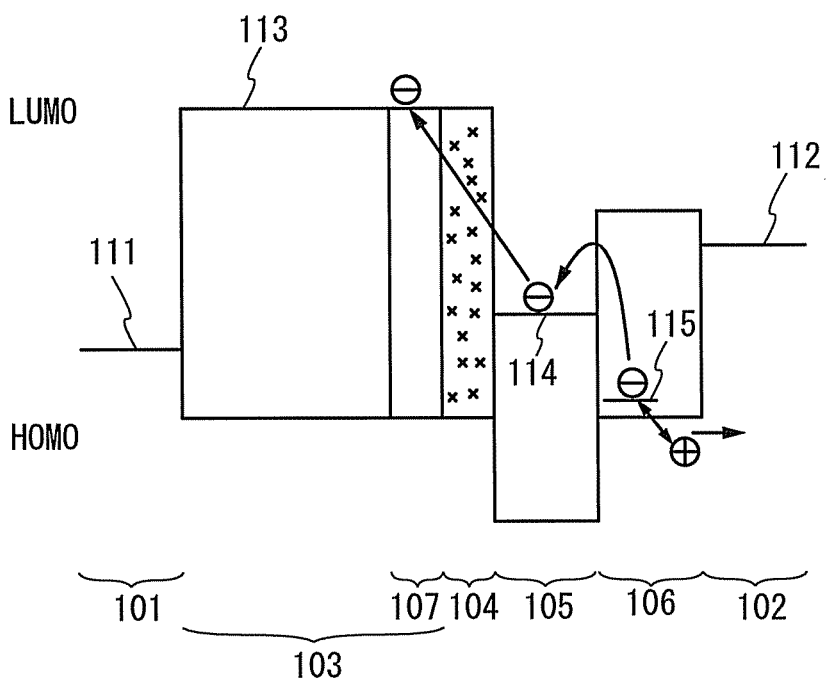

As illustrated in FIG. 4A, in the light-emitting element, the EL layer 103 including a light-emitting region is interposed between the pair of electrodes (the anode 101 and the cathode 102). Between the cathode 102 and the EL layer 103, the first layer 106 serving as a charge generation region, the second layer 105 serving as an electron-relay layer, and the third layer 104 serving as an electron-injection buffer are sequentially stacked over the cathode 102. The third layer 104 includes the substance having an electron-transport property and the donor substance.

In the third layer 104, the donor substance is preferably added so that the mass ratio thereof to the substance having an electron-transport property is greater than or equal to 0.001:1 and less than or equal to 0.1:1. Accordingly, the function as an electron-injection buffer is obtained.

The same materials as described in Embodiment 1 can be used for the anode 101, the cathode 102, the EL layer 103, the first layer 106, and the second layer 105 which are described in Embodiment 3.

Examples of the substance having an electron-transport property used for the third layer 104 which can be used are: metal complexes having a quinoline skeleton or a benzo-quinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq); metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$); and the like. Examples other than the metal complexes are 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-biphenylyl)-1,2,4-triazole (abbreviation: TAZ), bathophenanthroline (abbreviation: BPhen), bathocuproine (abbreviation: BCP), and the like. The substances described here are mainly substances having an electron mobility of 10−6 cm$^2$/Vs or more.

Other examples are high molecular compounds such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy).

Examples of the donor substance which can be used for the third layer 104 include organic compounds such as tetrathianaphthacene (abbreviation: TTN), nickelocene, and decamethylnickelocene, other than alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

The substance having an electron-transport property used for the third layer 104 may be the same as or different from the substance having an electron-transport property used for the fourth layer 107 serving as an electron-transport layer which is included in the EL layer 103.

In the light-emitting element of Embodiment 3, the third layer 104 including the substance having an electron-transport property and the donor substance is formed between the EL layer 103 and the second layer 105, as illustrated in FIG. 4A. FIG. 4B is a band diagram of this element structure. The symbol x denotes the donor substance.

By providing the third layer 104, an injection barrier between the second layer 105 and the EL layer 103 can be reduced. Accordingly, electrons generated in the first layer 106 can be easily injected from the second layer 105 into the EL layer 103.

Note that the structure described in this embodiment can be combined with a structure described in Embodiment 1 or Embodiment 2 as appropriate.

For example, in the second layer 105, the donor substance may be added so that the mass ratio thereof to the metal complex is greater than or equal to 0.001:1 and less than or equal to 0.1:1, as described in Embodiment 1. As the donor substance, a substance given in Embodiment 1 is used.

Embodiment 4

In this embodiment, structures of the first layer 106 will be described as examples of the light-emitting element described in Embodiment 1 with reference to FIGS. 5A and 5B.

The EL layer 103 including a light-emitting region is interposed between the pair of electrodes (the anode 101 and the cathode 102). Between the cathode 102 and the EL layer 103, the first layer 106, the second layer 105, and the third layer 104 are sequentially stacked over the cathode 102. Note that the same materials as described in Embodiments 1 to 3 can be used for the anode 101, the cathode 102, the EL layer 103, the second layer 105, and the third layer 104.

The first layer 106 is a region that includes the substance having a hole-transport property and the acceptor substance. In the first layer 106, the acceptor substance draws electrons from the substance having a hole-transport property, whereby holes and electrons are generated.

Figure 5A:
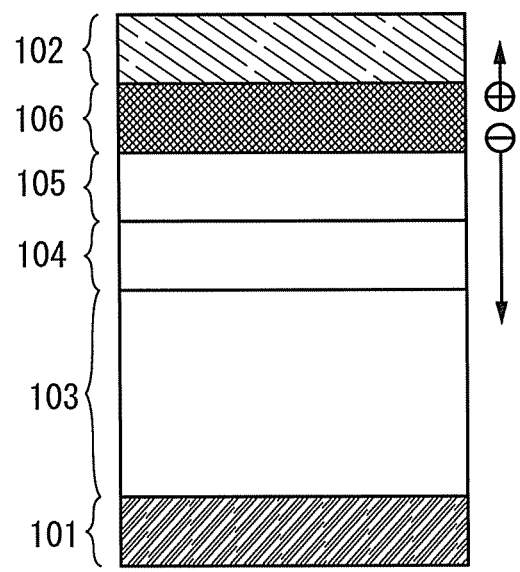
FIGS. 5A and 5B each illustrate an element structure of a light-emitting element.

The first layer 106 illustrated in FIG. 5A has a structure in which the substance having a hole-transport property and the acceptor substance are included in one film. In this case, the acceptor substance is preferably added so that the mass ratio thereof to the substance having a hole-transport property is greater than or equal to 0.1:1 and less than or equal to 4.0:1, because such addition facilitates carrier generation in the first layer 106.

Figure 5B:
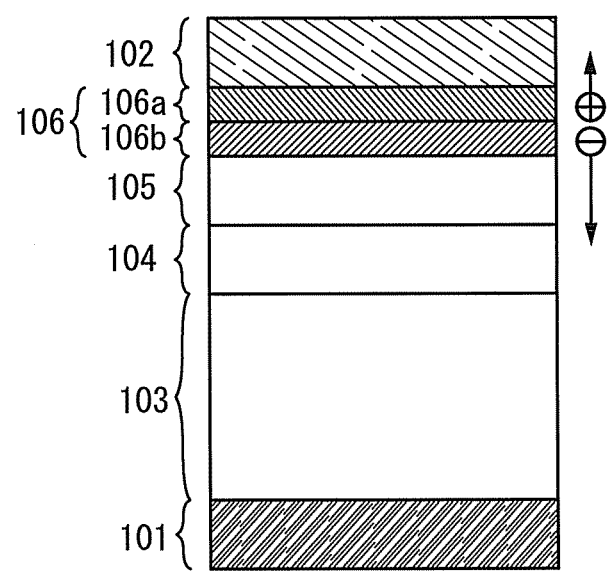

The first layer 106 illustrated in FIG. 5B has a structure in which a layer 106a including the substance having a hole-transport property and a layer 106b including the acceptor substance are stacked. The charge-transfer complex formed in the first layer 106 has absorption in the visible region. In the case where the layer 106a including the substance having a hole-transport property and the layer 106b including the acceptor substance are stacked, the charge-transfer complex is formed not in the whole of the first layer 106 but only at the interface between the layers 106a and 106b. This is preferable in that the formation of the charge-transfer complex at the interface makes it difficult for the charge-transfer complex to absorb light emission from the EL layer 103.

As the substance having a hole-transport property and the acceptor substance used for forming the first layer 106, substances described in Embodiment 1 can be used.

Note that the structure described in this embodiment can be combined with a structure described in Embodiments 1 to 3 as appropriate.

For example, in the second layer 105, the donor substance may be added so that the mass ratio thereof to the metal complex is greater than or equal to 0.001:1 and less than or equal to 0.1:1, as described in Embodiment 1. As the donor substance, a substance given in Embodiment 1 is used.

Embodiment 5

Figure 6A:
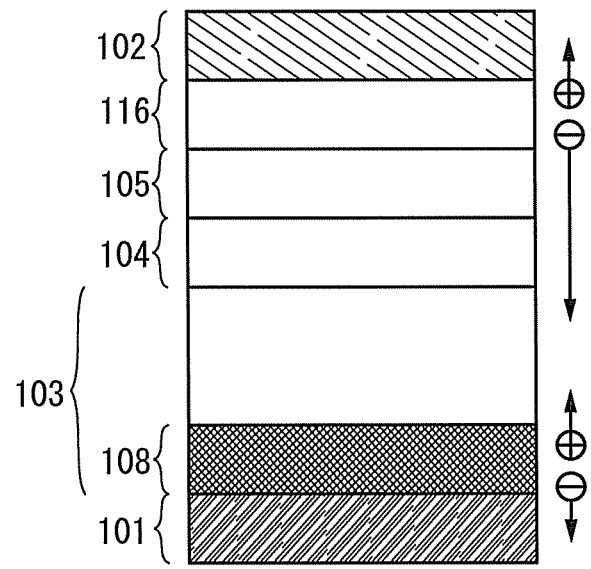
FIGS. 6A and 6B each illustrate an element structure of a light-emitting element.
Figure 6B:
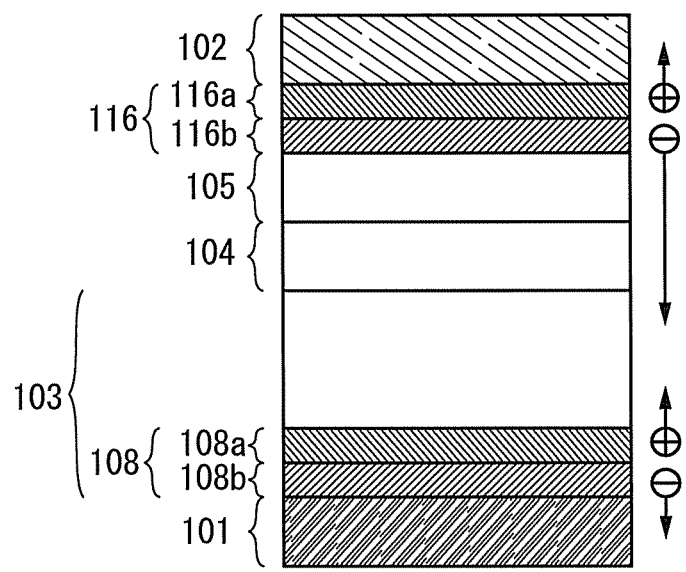

As an example of the light-emitting element described in Embodiment 1, this embodiment gives structures in which a charge generation region is formed so as to be included in part of the EL layer 103 and in contact with the anode 101 referring to FIGS. 6A and 6B. The light-emitting element includes a fifth layer 108 serving as a charge generation region which is included in the EL layer 103 and formed in contact with the anode 101 and a first layer 116 serving as the charge generation region described in Embodiment 1.

In the light-emitting element, the EL layer 103 including a light-emitting region is interposed between the pair of electrodes (the anode 101 and the cathode 102), and the fifth layer 108 serving as a charge generation region is provided to be included in the EL layer 103 and in contact with the anode 101. In the light-emitting element, between the cathode 102 and the EL layer 103, the first layer 116, the second layer 105, and the third layer 104 are sequentially stacked over the cathode 102. The same materials as described in Embodiments 1 to 4 can be used for the anode 101, the cathode 102, the EL layer 103, the third layer 104, the second layer 105, and the first layer 116.

In the light-emitting element illustrated in FIGS. 6A and 6B, like the first layer 116, the fifth layer 108 is a region including the substance having a hole-transport property and the acceptor substance. Thus, in the fifth layer 108, the acceptor substance draws electrons from the substance having a hole-transport property, whereby holes and electrons are generated. The holes are injected into the EL layer 103, and the electrons move to the anode 101.

The fifth layer 108 illustrated in FIG. 6A has a structure in which the substance having a hole-transport property and the acceptor substance are included in one film. In this case, the acceptor substance is preferably added so that the mass ratio thereof to the substance having a hole-transport property is greater than or equal to 0.1:1 and less than or equal to 4.0:1 to facilitate carrier generation in the fifth layer 108. Further, in FIG. 6A, the fifth layer 108 and first layer 116 are preferably formed with the same material in that stress on the anode 101 side of the light-emitting element and stress on the cathode 102 side thereof can be uniform.

The fifth layer 108 illustrated in FIG. 6B has a structure in which a layer 108a including the substance having a hole-transport property and a layer 108b including the acceptor substance are stacked. The charge-transfer complex formed in the fifth layer 108 has absorption in the visible region. In the case where the layer 108a including the substance having a hole-transport property and the layer 108b including the acceptor substance are stacked, the charge-transfer complex is formed not in the whole of the fifth layer 108 but only at the interface between the layers 108a and 108b. This is preferable in that the formation of the charge-transfer complex at the interface makes it difficult for the charge-transfer complex to absorb light emission from the EL layer 103. Note that as illustrated in FIG. 6B, the first layer 116 may also have a structure in which a layer 116a including the substance having a hole-transport property and a layer 116b including the acceptor substance are stacked.

As the substance having a hole-transport property used for the fifth layer 108, it is possible to use a substance given as the substance having a hole-transport property used for the first layer 106 in Embodiment 1. In addition, as the acceptor substance used for the fifth layer 108, it is possible to use a substance given as the acceptor substance used for the first layer 106 described in Embodiment 1.

Note that the structure described in Embodiment 5 can be combined with a structure described in Embodiments 1 to 4 as appropriate.

For example, in the second layer 105, the donor substance may be added so that the mass ratio thereof to the metal complex is greater than or equal to 0.001:1 and less than or equal to 0.1:1, as described in Embodiment 1. As the donor substance, a substance given in Embodiment 1 is used.

Embodiment 6

In this embodiment, as examples of a light-emitting device manufactured using the light-emitting element described in any of Embodiments 1 to 5, a passive matrix light-emitting device and an active matrix light-emitting device will be described.

FIGS. 7A to 7D and FIG. 8 illustrate an example of the passive matrix light-emitting device.

In the passive-matrix (also called simple-matrix) light-emitting device, anodes arranged in stripes (in stripe form) are provided to intersect at right angles with cathodes arranged in stripes. At their intersections, a light-emitting layer is interposed. Thus, light is emitted from a pixel at the intersection of an anode which is selected (to which a voltage is applied) and a cathode which is selected.

Figure 7A:
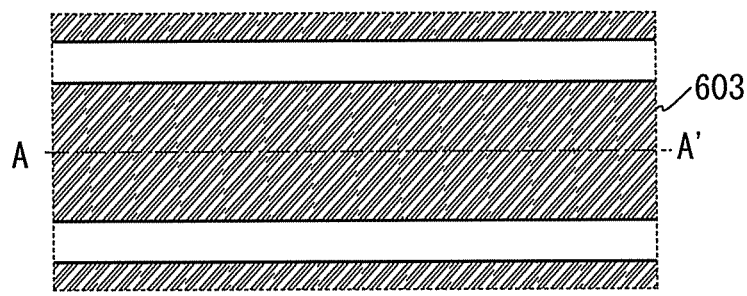
FIGS. 7A to 7D illustrate a passive matrix light-emitting device.
Figure 7B:
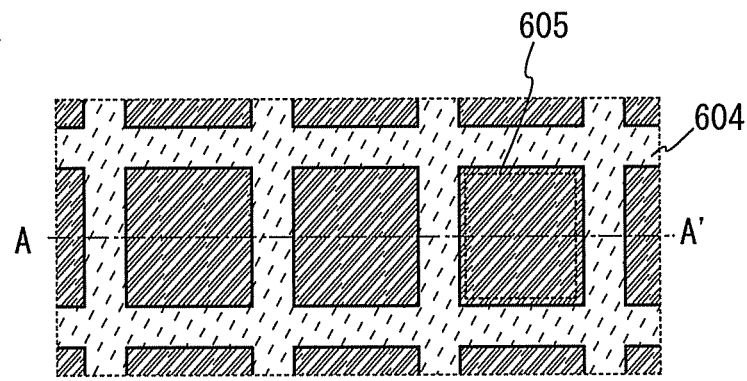
Figure 7C:
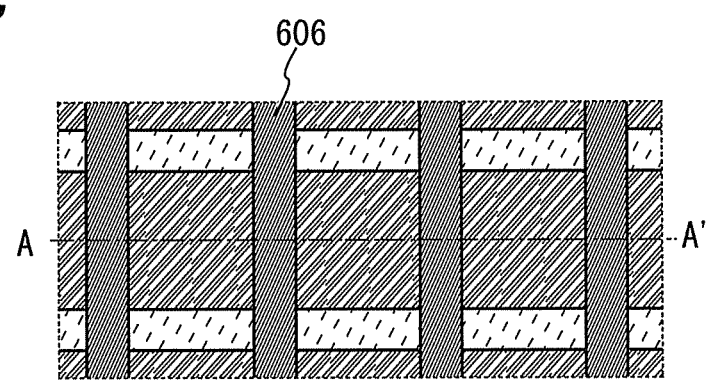
Figure 7D:
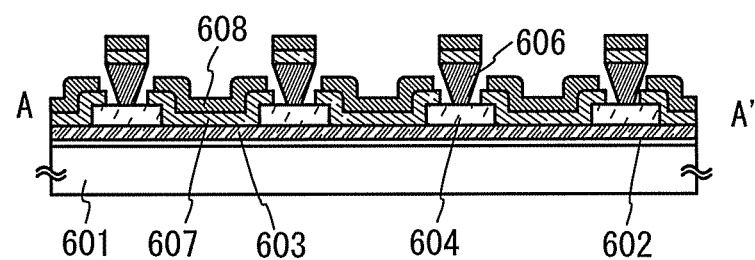

FIGS. 7A to 7C are top views of a pixel portion before sealing. FIG. 7D is a cross-sectional view taken along chain line A-A' in FIGS. 7A to 7C.

Over a substrate 601, an insulating layer 602 is formed as a base insulating layer. Note that the base insulating layer is not necessarily formed if not needed. Over the insulating layer 602, first electrodes 603 are arranged in stripes at regular intervals (FIG. 7A).

In addition, partition 604 having openings corresponding to the pixels is provided over the first electrodes 603. The partition 604 having the openings is formed with an insulating material, such as a photosensitive material or a nonphotosensitive organic material (e.g., polyimide, acrylic, polyamide, polyimide amide, resist, or benzocyclobutene) or a spin-on-glass (SOG) film (e.g., a $SiO_x$, film containing an alkyl group). Note that openings 605 corresponding to the pixels serve as light-emitting regions (FIG. 7B).

Over the partition 604 having the openings, reversely tapered partitions 606 which are parallel to each other are provided to intersect with the first electrodes 603 (FIG. 7C). The reversely tapered partitions 606 are formed in such a manner that, according to a photolithography method, a positive photosensitive resin, an unexposed portion of which serves as a pattern, is used and the amount of exposed light or the length of development time is adjusted so that a lower portion of the pattern is etched more.

After the reversely tapered partitions 606 are formed as illustrated in FIG. 7C, a layer 607 containing an organic compound and a second electrode 608 are sequentially formed as illustrated in FIG. 7D. Note that the layer 607 containing an organic compound described in this embodiment includes at least the EL layer, the first layer, the second layer, and the third layer which are described as the layers formed between the anode and the cathode in Embodiments 1 to 5. The sum of the heights of the partition 604 having the openings and the reversely tapered partition 606 is set to exceed the sum of the thicknesses of the layer 607 containing an organic compound and the second electrode 608. Consequently, as illustrated in FIG. 7D, divided regions each including the layer 607 containing an organic compound and the second electrode 608 are formed. Note that the divided regions are electrically isolated from one another.

The second electrodes 608 are electrodes that extend in the direction in which they intersect with the first electrodes 603 and that are arranged in stripes to be parallel to one another. Although a part of the layer 607 containing an organic compound and a part of a conductive layer for forming the second electrode 608 are formed even over the reversely tapered partition 606, these parts are insulated from the layers 607 containing an organic compound and the second electrodes 608.

Note that there is no limitation on the first electrode 603 and the second electrode 608 in this embodiment as long as one of them is an anode and the other is a cathode. Further, the stack structure of the layer 607 containing an organic compound is adjusted as appropriate depending on the polarities of the electrodes so as to have the structure described in any of Embodiments 1 to 5.

Further, if necessary, a sealing material such as a sealing can or a glass substrate may be attached to the substrate 601 to perform sealing with an adhesive such as a sealant so that a light-emitting element is placed in the sealed space. This can prevents deterioration of the light-emitting element. Note that the sealed space may be filled with a filler or a dry inert gas. Further, a desiccant or the like may be put between the substrate and the sealing material to prevent deterioration of the light-emitting element due to moisture or the like. The desiccant removes a minute amount of moisture, thereby achieving sufficient desiccation. The desiccant can be a substance that absorbs moisture by chemical adsorption, such as an oxide of an alkaline-earth metal typified by calcium oxide or barium oxide. Other than the above, a substance that adsorbs moisture by physical adsorption, such as zeolite or silica gel, may be used.

Figure 8:
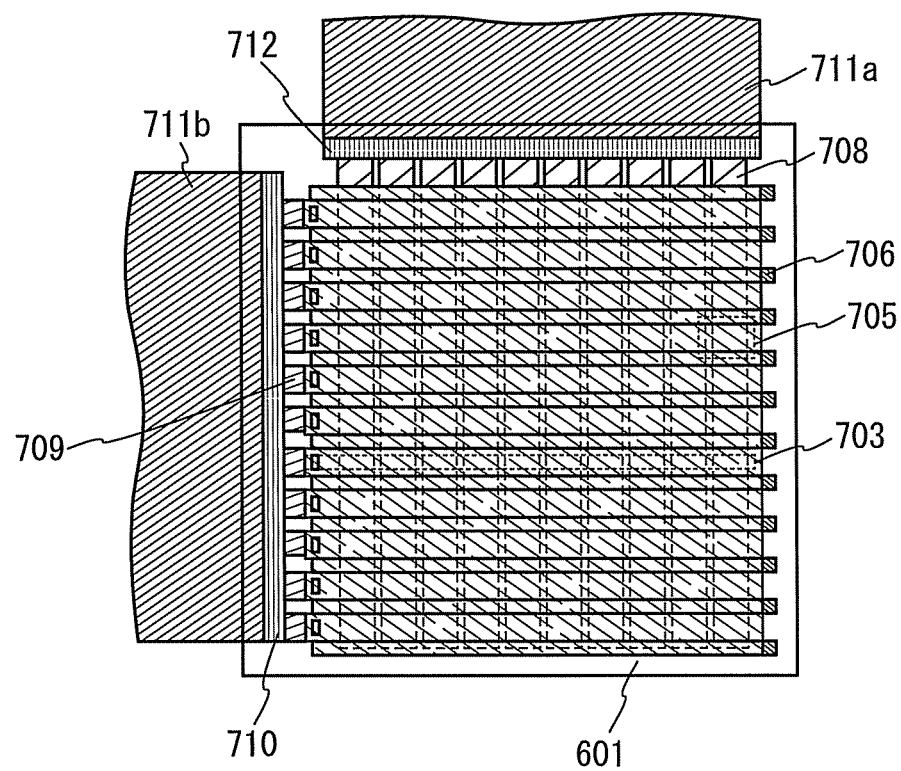
FIG. 8 illustrates a passive matrix light-emitting device.

FIG. 8 is a top view of the passive matrix light-emitting device illustrated in FIGS. 7A to 7D, on which an FPC and the like are mounted.

In FIG. 8, scan lines and data lines intersect at right angles in the pixel portion for displaying images.

Here, the first electrode 603 in FIGS. 7A to 7D corresponds to a scan line 703 in FIG. 8, the second electrode 608 in FIGS. 7A to 7D corresponds to a data line 708 in FIG. 8, and the reversely tapered partition 606 corresponds to a partition 706 in FIG. 8. The layer including an organic compound 607 in FIGS. 7A to 7D is interposed between the data lines 708 and the scan lines 703, and an intersection portion indicated as a region 705 corresponds to one pixel.

Note that the scanning lines 703 are electrically connected at their ends to connection wirings 709, and the connection wirings 709 are connected to an FPC 711b via an input terminal 710. In addition, the data lines 708 are connected to an FPC 711a via an input terminal 712.

If necessary, a polarizing plate, a circularly polarizing plate (including an elliptically polarizing plate), a retardation plate (a quarter-wave plate or a half-wave plate), or an optical film such as a color filter may be provided as appropriate on a surface through which light from the light-emitting layer is emitted. The polarizing plate or the circularly polarizing plate may be provided with an anti-reflection film. For example, anti-glare treatment by which reflected light can be diffused by projections and depressions on the surface so as to reduce the glare can be performed.

Note that, although FIG. 8 illustrates an example in which a driver circuit is not provided over the substrate, an IC chip including a driver circuit may be mounted on the substrate.

When the IC chip is mounted, in the peripheral (outside) region of the pixel portion, ICs in which a driver circuit for transmitting a signal to the pixel portion is formed are mounted on the data line side IC and/or the scan line side by a COG method. As the mounting technique other than the COG method, a TCP or a wire bonding method may be used. A TCP is obtained by mounting an IC on a TAB tape in such a manner that the TAB tape is connected to a wiring over an element formation substrate and the IC is mounted. The ICs on the data line side and the scan line side may be formed using a silicon substrate, or may be formed by formation of a driver circuit with a TFT over a glass substrate, a quartz substrate, or a plastic substrate.

Figure 9A:
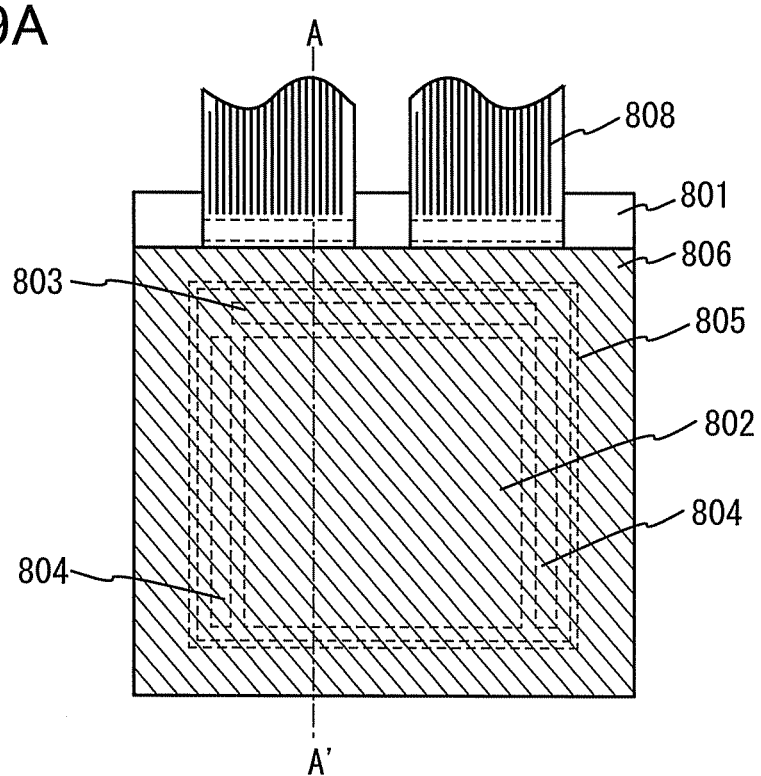
FIGS. 9A and 9B illustrate an active matrix light-emitting device.
Figure 9B:
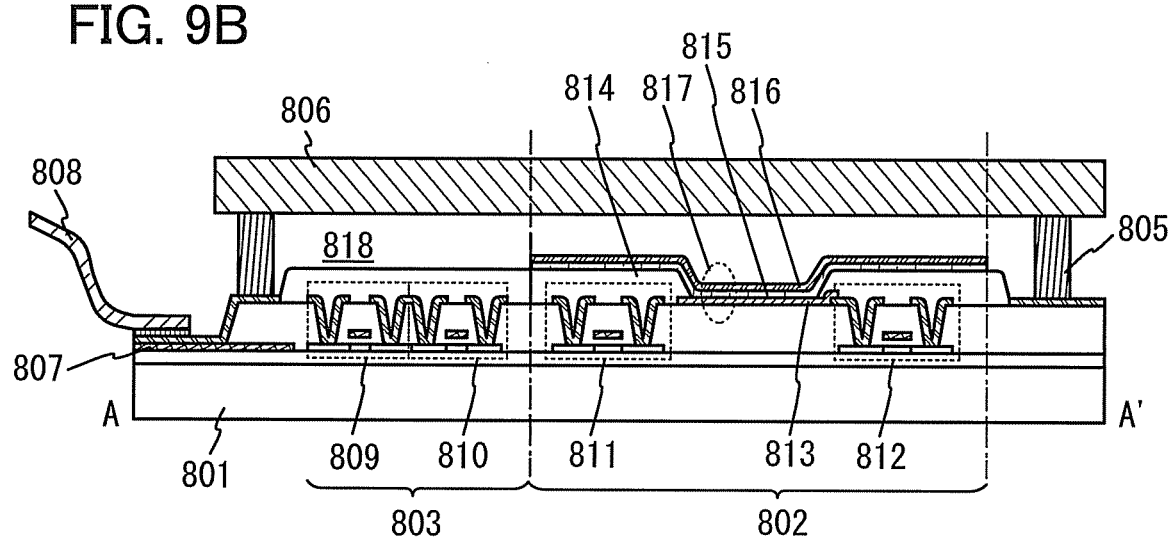

Next, an example of an active-matrix light-emitting device will be described with reference to FIGS. 9A and 9B. Note that FIG. 9A is a top view illustrating the light-emitting device and FIG. 9B is a cross-sectional view taken along the chain line A-A' in FIG. 9A. The active matrix light-emitting device according to this embodiment includes a pixel portion 802 provided over an element substrate 801, a driver circuit portion (a source driver circuit) 803, and a driver circuit portion (a gate driver circuit) 804. The pixel portion 802, the driver circuit portion 803, and the driver circuit portion 804 are sealed between the element substrate 801 and the sealing substrate 806 by the sealing material 805.

In addition, over the element substrate 801, a lead wiring 807 for connecting an external input terminal, through which signals from the outside (e.g., a video signal, a clock signal, a start signal, and a reset signal) or an electric potential is transmitted to the driver circuit portion 803 and the driver circuit portion 804, is provided. Here, an example in which an FPC (flexible printed circuit) 808 is provided as the external input terminal is described. Although only the FPC is illustrated here, a printed wiring board (PWB) may be attached to this FPC. The light-emitting device in this specification includes not only a light-emitting device itself but also a light-emitting device provided with an FPC or a PWB.

Next, a cross-sectional structure will be described with reference to FIG. 9B. The driver circuit portion and the pixel portion are formed over the element substrate 801, and here the driver circuit portion 803 which is the source driver circuit and the pixel portion 802 are illustrated.

An example of the driver circuit portion 803, a CMOS circuit which is a combination of an n-channel TFT 809 and a p-channel TFT 810 is formed. Note that a circuit included in the driver circuit portion may be formed using various types of circuits such as CMOS circuits, PMOS circuits, or NMOS circuits. Although a driver integrated type in which the driver circuit is formed over the substrate in this embodiment, the driver circuit may not necessarily be formed over the substrate, and the driver circuit can be formed outside, not over the substrate.

The pixel portion 802 includes pixels each of which includes a switching TFT 811, a current control TFT 812, and an anode 813 electrically connected to a wiring (a source electrode or a drain electrode) of the current control TFT 812. Note that an insulator 814 is formed to cover an end portion of the anode 813. Here, the insulator 814 is formed using a positive photosensitive acrylic resin.

The insulator 814 is preferably formed so as to have a curved surface with curvature at an upper end portion or a lower end portion thereof in order to obtain favorable coverage by a film which is to be stacked over the insulator 814. For example, in the case where a positive photosensitive acrylic resin is used as a material for the insulator 814, the insulator 814 is preferably formed so as to have a curved surface with a curvature radius (0.2 µm to 3 µm) at the upper end portion. Note that either a negative photosensitive material that becomes insoluble in an etchant by light irradiation or a positive photosensitive material that becomes soluble in an etchant by light irradiation can be used for the insulator 814. As the insulator 814, without limitation to an organic compound, either an organic compound or an inorganic compound such as silicon oxide or silicon oxynitride can also be used.

A layer 815 including an organic compound and a cathode 816 are stacked over the anode 813. Note that when an ITO film is used as the anode 813, and a stacked film of a titanium nitride film and a film containing aluminum as its main component or a stacked film of a titanium nitride film, a film containing aluminum as its main component, and a titanium nitride film is used as the wiring of the current controlling TFT 812 which is connected to the anode 813, resistance of the wiring is low and favorable ohmic contact with the ITO film can be realized. Note that, although not illustrated here, the cathode 816 is electrically connected to the FPC 808 which is an external input terminal.

Note that the layer 815 containing an organic compound described in this embodiment includes at least the EL layer, the first layer, the second layer, and the third layer which are described as the layers formed between the anode and the cathode in Embodiments 1 to 5. In the EL layer, at least the light-emitting layer is provided, and in addition to the light-emitting layer, a hole-injection layer, a hole-transport layer, an electron-transport layer, or an electron-injection layer is provided as appropriate. A light-emitting element 817 has a stacked structure of the anode 813, the layer 815 containing an organic compound, and the cathode 816.

Although the cross-sectional view of FIG. 9B illustrates only one light-emitting element 817, light-emitting elements are arranged in matrix in the pixel portion 802. Note that when color display with color components of R (red), G (green) and B (blue) is performed, light-emitting elements which emit three-color (R, G, and B) light are formed in the pixel portion 802. In addition, the number of the color components is not limited to three, and four or more colors may be used or a color other than RGB may be used. For example, RGBW (W indicates white) display can be used by addition of white.

As methods for fabricating light-emitting elements having different color components, any of the following methods can be employed: a method in which EL layers for different colors are separately formed; a method in which EL layers all of which are formed so as to emit white light are combined with color filters, so that light-emitting elements having different color components are formed; and a method in which EL layers all of which are formed so as to emit blue light or light having a shorter wavelength than blue light and combined with color conversion layers, so that light-emitting elements for different color components are formed; and the like.

Further, the sealing substrate 806 is attached to the element substrate 801 with the sealing material 805, whereby the light-emitting element 817 is provided in a space 818 surrounded by the element substrate 801, the sealing substrate 806, and the sealing material 805. The space 818 may be filled with an inert gas (such as nitrogen or argon), or the sealing material 805.

Note that an epoxy-based resin is preferably used as the sealing material 805. Such a material preferably allows as little moisture and oxygen as possible to penetrate. As a material used for the sealing substrate 806, a plastic substrate formed of FRP (fiberglass-reinforced plastics), PVF (polyvinyl fluoride), polyester, acrylic, or the like can be used other than a glass substrate or a quartz substrate.

As described above, an active matrix light-emitting device can be obtained.

Note that the structure described in Embodiment 6 can be combined with a structure described in Embodiments 1 to 5 as appropriate.

Embodiment 7

This embodiment gives examples of various electronic devices and lighting devices, which are completed using the light-emitting device fabricated by applying one embodiment of the present invention, with reference to FIGS. 10A to 10E and FIG. 11.

Examples of the electronic devices to which the light-emitting device of one embodiment of the present invention is applied are television devices (also referred to as TV or television receivers), monitors for computers and the like, cameras such as digital cameras and digital video cameras, digital photo frames, cellular phones (also referred to as cellular phones or portable telephone devices), portable game machines, portable information terminals, audio playback devices, large game machines such as pin-ball machines, and the like. Specific examples of these electronic devices and a lighting device are illustrated in FIGS. 10A to 10E.

Figure 10A:
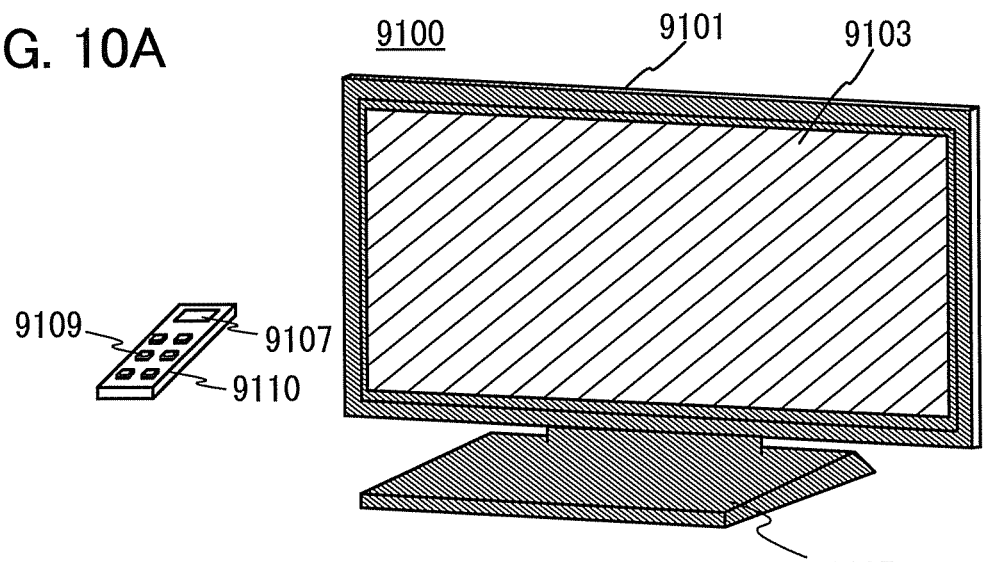
FIGS. 10A to 10E each illustrate an electronic device.

FIG. 10A illustrates an example of a television device. In the television device 9100, a display portion 9103 is incorporated in a housing 9101. Images can be displayed by the display portion 9103, and the light-emitting device formed according to one embodiment of the present invention can be used for the display portion 9103. In addition, here, the housing 9101 is supported by a stand 9105.

The television device 9100 can be operated by an operation switch of the housing 9101 or a separate remote controller 9110. With operation keys 9109 of the remote controller 9110, channels and volume can be controlled and images displayed on the display portion 9103 can be controlled. Furthermore, the remote controller 9110 may be provided with a display portion 9107 for displaying data output from the remote controller 9110.

Note that the television device 9100 is provided with a receiver, a modem, and the like. With the receiver, general television broadcasting can be received. Furthermore, when the television device 9100 is connected to a communication network by wired or wireless connection via the modem, one-way (from a transmitter to a receiver) or two-way (between a transmitter and a receiver, between receivers, or the like) data communication can be performed.

Note that the light-emitting device formed according to one embodiment of the present invention has lower power consumption. Thus, by using the light-emitting device the display portion 9103 of the television set, the television set can have a long lifetime.

Figure 10B:
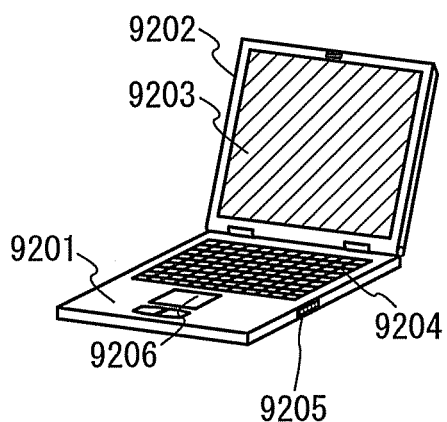

FIG. 10B illustrates a computer, which includes a main body 9201, a housing 9202, a display portion 9203, a keyboard 9204, an external connecting port 9205, a pointing device 9206, and the like. This computer is manufactured by using a light-emitting device formed according to one embodiment of the present invention for the display portion 9203.

Note that the light-emitting device formed according to one embodiment of the present invention has lower power consumption. Thus, by using the light-emitting device the display portion 9203 of the computer, the computer can have a long lifetime.

Figure 10C:
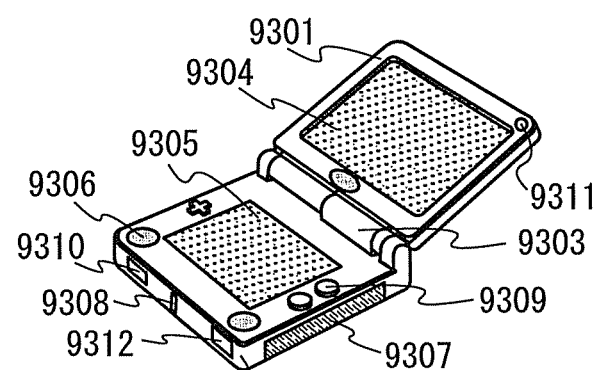

FIG. 10C illustrates a portable game machine, which includes two housings, a housing 9301 and a housing 9302, which are connected with a joint portion 9303 so that the portable game machine can be opened or folded. A display portion 9304 is incorporated in the housing 9301 and a display portion 9305 is incorporated in the housing 9302. In addition, the portable game machine illustrated in FIG. 10C includes a speaker portion 9306, a recording medium insertion portion 9307, an LED lamp 9308, an input means (an operation key 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9312), and the like. It is needless to say that the structure of the portable games machine is not limited to the above as long as the light-emitting device formed according to one embodiment of the present invention is used for at least either the display portion 9304 or the display portion 9305, or both. The portable game machine illustrated in FIG. 10C has a function of reading out a program or data stored in a storage medium to display it on the display portion, and a function of sharing information with another portable game machine by wireless communication. The portable game machine illustrated in FIG. 10C can have a variety of functions without limitation to the above.

Note that the light-emitting device formed according to one embodiment of the present invention has lower power consumption. Thus, by using the light-emitting device for the display portions (9304, 9305) of the portable amusement machine, the portable amusement machine can have a long lifetime.

Figure 10D:
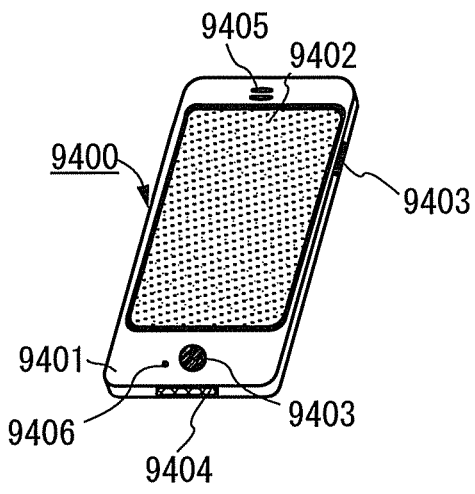

FIG. 10D illustrates an example of a cellular phone. The cellular phone 9400 is provided with a display portion 9402 incorporated in a housing 9401, operation buttons 9403, an external connection port 9404, a speaker 9405, a microphone 9406, and the like. Note that the cellular phone 9400 is manufactured using a light-emitting device formed according to one embodiment of the present invention for the display portion 9402.

When the display portion 9402 of the cellular phone 9400 illustrated in FIG. 10D is touched with a finger or the like, data can be input into the cellular phone 9400. Further, operations such as making a call and creating e-mail can be performed by touching the display portion 9402 with a finger or the like.

There are mainly three screen modes of the display portion 9402. The first mode is a display mode mainly for displaying an image. The second mode is an input mode mainly for inputting information such as characters. The third mode is a display-and-input mode in which two modes of the display mode and the input mode are mixed.

For example, in the case of making a call or creating e-mail, a text input mode mainly for inputting text is selected for the display portion 9402 so that text displayed on a screen can be inputted. In that case, it is preferable to display a keyboard or number buttons on almost all the area of the screen of the display portion 9402.

When a detection device including a sensor for detecting inclination, such as a gyroscope or an acceleration sensor, is provided inside the cellular phone 9400, display on the screen of the display portion 9402 can be automatically changed by determining the orientation of the cellular phone 9400 (whether the cellular phone is placed horizontally or vertically for a landscape mode or a portrait mode).

The screen modes are switched by touching the display portion 9402 or operating the operation buttons 9403 of the housing 9401. Alternatively, the screen modes can be switched depending on kinds of images displayed on the display portion 9402. For example, when a signal for an image displayed in the display portion is data of moving images, the screen mode is switched to the display mode. When the signal is text data, the screen mode is switched to the input mode.

Moreover, in the input mode, when input by touching the display portion 9402 is not performed within a specified period while a signal detected by an optical sensor in the display portion 9402 is detected, the screen mode may be controlled so as to be switched from the input mode to the display mode.

The display portion 9402 can function as an image sensor. For example, an image of a palm print, a fingerprint, or the like is taken by touching the display portion 9402 with the palm or the finger, whereby personal authentication can be performed. Furthermore, by provision of a backlight or a sensing light source emitting a near-infrared light for the display portion, an image of a finger vein, a palm vein, or the like can also be taken.

Note that the light-emitting device formed according to one embodiment of the present invention has lower power consumption. Thus, by using the light-emitting device for the display portion 9402 of the mobile phone 9400, the mobile phone can have a long lifetime.

Figure 10E:
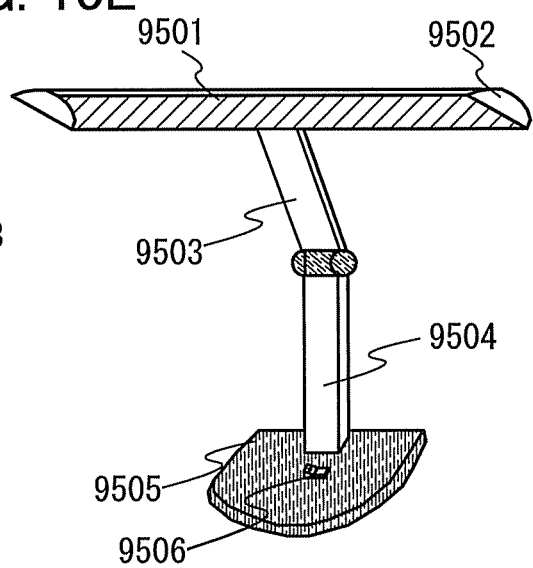

FIG. 10E illustrates a lighting device (a desk lamp) including a lighting portion 9501, a lampshade 9502, an adjustable arm 9503, a support 9504, a base 9505, and a power supply 9506. This lighting device is manufactured using a light-emitting device formed according to one embodiment of the present invention for the lighting portion 9501. Note that the "lighting device" also encompasses ceiling lights (ceiling-fixed lighting devices), wall lights (wall-hanging lighting devices), and the like, as well as the desk lamp illustrated in FIG. 10E.

Note that the light-emitting device formed according to one embodiment of the present invention has lower power consumption. Thus, by using the light-emitting device for the lighting portion 9501 of the lighting device (desk lamp), the lighting device (desk lamp) can have a long lifetime.

Figure 11:
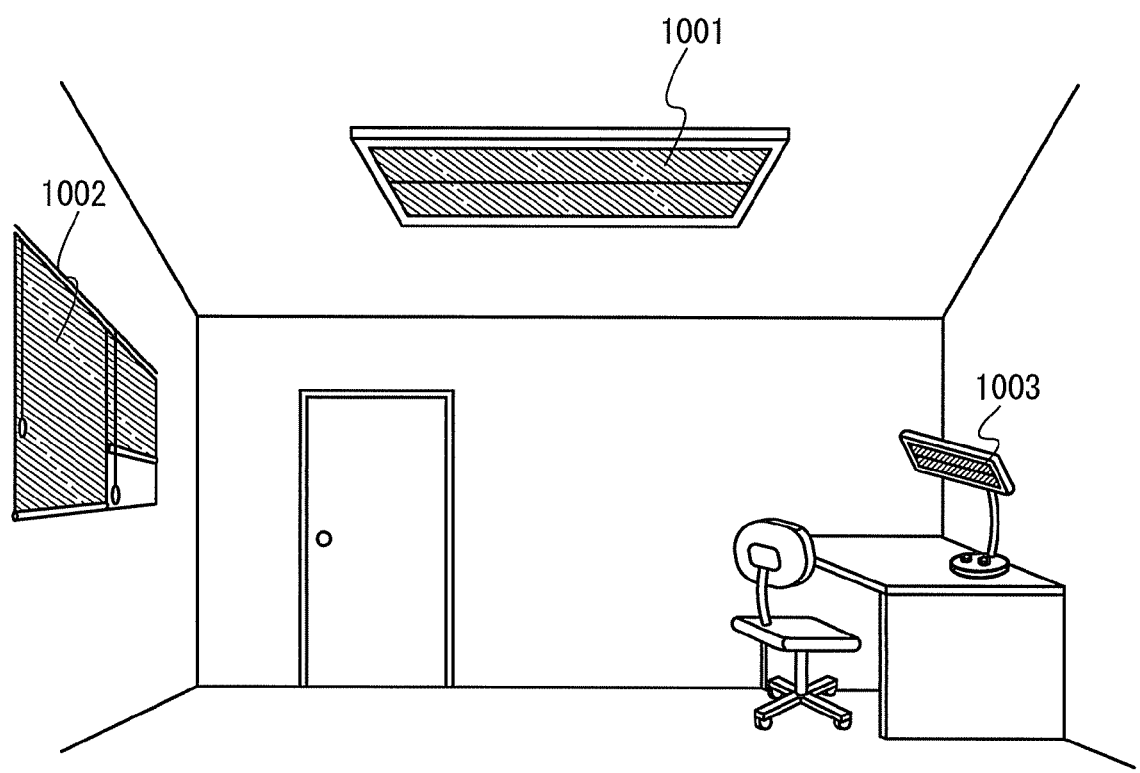
FIG. 11 illustrates lighting devices.

FIG. 11 illustrates an example in which a light-emitting device to which one embodiment of the present invention is applied is used as an interior lighting device. Since the light-emitting device of one embodiment of the present invention can also have a larger area, it can be used as a lighting device having a large area as illustrated as a ceiling light 1001. Additionally, the light-emitting device can be used as a wall light 1002. Since the light-emitting device formed according to one embodiment of the present invention has the light-emitting element with low driving voltage, the light-emitting device can be used as a lighting device with low power consumption. Note that as illustrated in FIG. 11, a desk lamp 1003 described with reference to FIG. 10E may be used together in a room provided with the indoor lighting device.

In the above-described manner, electronic devices or lighting devices can be obtained by application of a light-emitting device which is one embodiment of the present invention. Application range of the light-emitting device of one embodiment of the present invention is so wide that the light-emitting device can be applied to electronic devices in a variety of fields.

Note that the structure described in this embodiment can be combined with a structure described in Embodiments 1 to 6 as appropriate.

Example 1

In this example, a light-emitting element according to one embodiment of the present invention will be described. In this example, Light-Emitting Elements A to C and Reference Light-Emitting Element a were formed, and comparisons of voltage versus luminance characteristics and voltage versus current density characteristics were made between these elements. As a result, it was shown that Light-Emitting Elements A to C were able to have lower driving voltage than Reference Light-Emitting Element a, which indicated that a second layer provided in each of Light-Emitting Elements A to C had a considerable effect.

In Light-Emitting Element A, VOPc was used for the second layer. In Light-Emitting Element B, SnOPc was used for the second layer. In Light-Emitting Element C, TiOPc was used for the second layer. The second layer was not provided in Reference Light-Emitting Element a.

In each of Light-Emitting Elements A to C and Reference Light-Emitting Element a, indium tin oxide containing silicon oxide was used for an anode, aluminum was used for a cathode, NPB and molybdenum oxide were used for a first layer, and lithium oxide ($Li_2O$) was used for a third layer. In the EL layer, NPB and molybdenum oxide were used for a fifth layer, NPB was used for a hole-transport layer, CzPA and 2PCAPA were used for a light-emitting layer, and Alq and BPhen were used for a fourth layer. Structural formulae of materials used in this example are illustrated below.

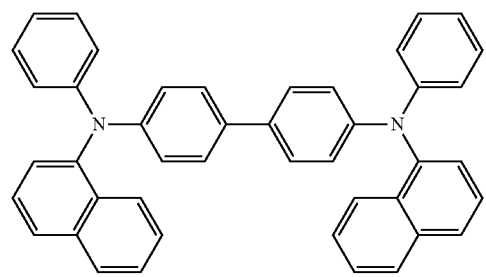

NPB

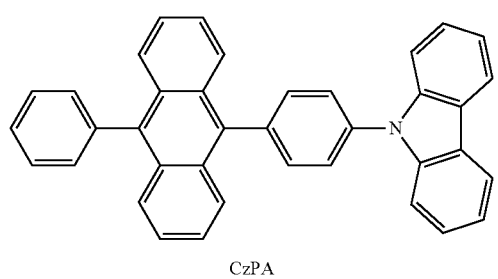

CzPA

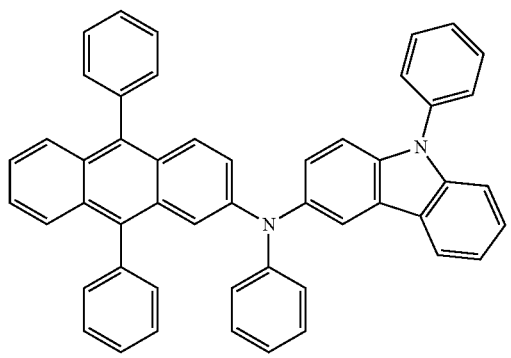

2PCAPA

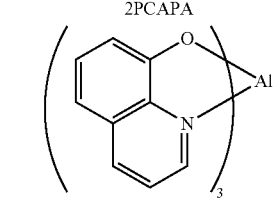

Alq

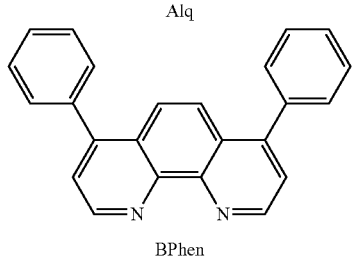

BPhen (Formation of Light-Emitting Elements A to C and Reference Light-Emitting Element a)

First, indium tin oxide containing silicon or silicon oxide was deposited to a thickness of 110 nm over a glass substrate by a sputtering method to form the anode (the electrode area was 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about $10^{-4}$ Pa, and then, co-evaporation of 4,4'-bis[N-(1-naphthyl)-N-phenylamino]biphenyl (abbreviation: NPB), which is a substance having a hole-transport property, and molybdenum(VI) oxide, which is an acceptor substance, was performed, so that the fifth layer was formed. The thickness thereof was 50 nm, and the mass ratio of NPB to molybdenum(VI) oxide was adjusted to 4:1 (NPB:molybdenum oxide). Note that the co-evaporation method refers to an evaporation method in which evaporation is carried out from evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (CzPA) and N-(9,10-diphenyl-2-anthryl)-N,9-diphenyl-9H-carbazol-3-amine (abbreviation: 2PCAPA) were co-evaporated so that the mass ratio of CzPA:2PCAPA was 1:0.05 to form the light-emitting layer. CzPA is a substance that has an electron-transport property and 2PCAPA is a substance that emits green light. The thickness of the light-emitting layer was 30 nm.

Next, tris(8-quinolinolato)aluminum (abbreviation: Alq) was deposited to a thickness of 10 nm by an evaporation method using resistance heating and then bathophenanthroline (abbreviation: BPhen) was deposited to a thickness of 10 nm also by an evaporation method using resistance heating, whereby the fourth layer was formed.

Next, lithium oxide ($Li_2O$) was deposited to a thickness of about 0.1 nm by an evaporation method using resistance heating to form the third layer.

Next, each of VOPc, SnOPc, and TiOPc was deposited to a thickness of about 3 nm by an evaporation method using resistance heating to form the second layer. VOPc, SnOPc, and TiOPc were deposited in Light-Emitting Elements A, B, and C, respectively. In Reference Light-Emitting Element a, the second layer was not provided.

Next, 4,4'-bis[N-(1-naphthyl)-N-phenylamino]biphenyl (abbreviation: NPB), which is a substance having a hole-transport property, and molybdenum(VI) oxide, which is an acceptor substance, were co-evaporated to form the first layer. The thickness thereof was 20 nm, and the mass ratio of NPB to molybdenum(VI) oxide was adjusted to 4:1 (NPB:molybdenum oxide).

Next, aluminum was deposited to a thickness of 200 nm to form the cathode. In this manner, Light-Emitting Elements A to C and Reference Light-Emitting Element a were formed.

Table 1 below shows part of the element structures of Light-Emitting Elements A to C and Reference Light-Emitting Element a. Light-Emitting Elements A to C correspond to the light-emitting element described in any of Embodiments 1, 2, 4, and 5. The structures of the anode, the fifth layer, the hole-transport layer, the light-emitting layer, and the fourth layer are common to Light-Emitting Elements A to C and Reference Light-Emitting Element a, and thus not described here.

TABLE 1

|  | Anode | * | The third layer | The second layer | The first layer | Cathode |
|---|---|---|---|---|---|---|
| Light-Emitting Element A | NITO (110 nm) | ** | $Li_2O$ (0.1 nm) | VOPc (3 nm) | NPB:$MoO_x$ (4:1, 20 nm) | Al (200 nm) |
| Light-Emitting Element B |  |  |  | SnOPc (3 nm) |  |  |
| Light-Emitting Element C |  |  |  | TiOPc (3 nm) |  |  |
| Reference Light-Emitting Element a |  |  |  | — |  |  |

* The fifth layer, the hole-transport layer, the light-emitting layer, and the fourth layer are omitted.
** The materials and thicknesses of the layers are omitted.

Light-Emitting Elements A to C and Reference Light-Emitting Element a thus obtained were put into a glove box under a nitrogen atmosphere and the light-emitting elements were sealed so as not to be exposed to atmospheric air. The operation characteristics of these light-emitting elements were measured. The measurements were performed at room temperature (under an atmosphere kept at 25° C.). From each light emitting element, green light at a wavelength of around 520 nm emitted by 2PCAPA, which is a light-emitting substance, was obtained.

Figure 12:
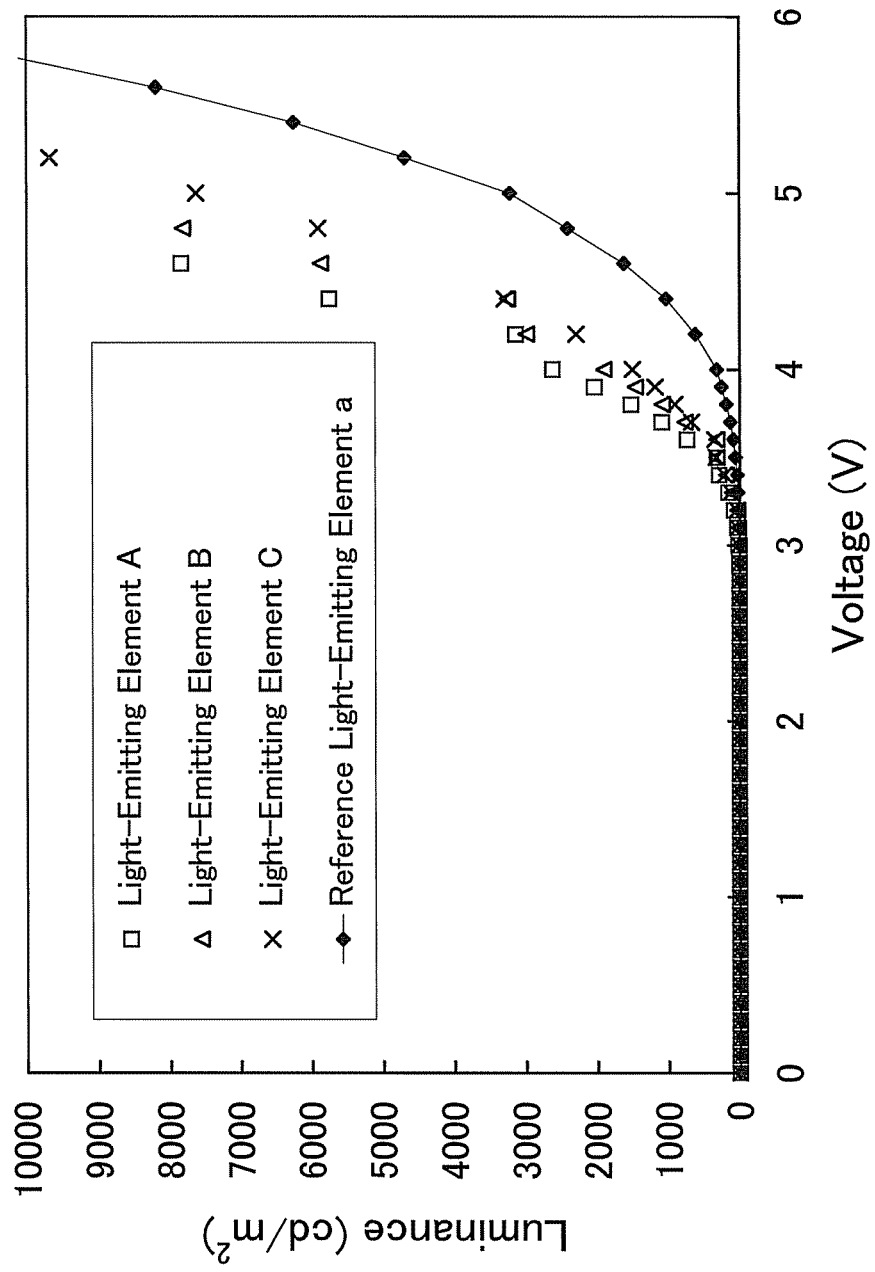
FIG. 12 shows characteristics of light-emitting elements of Example 1.
Figure 13:
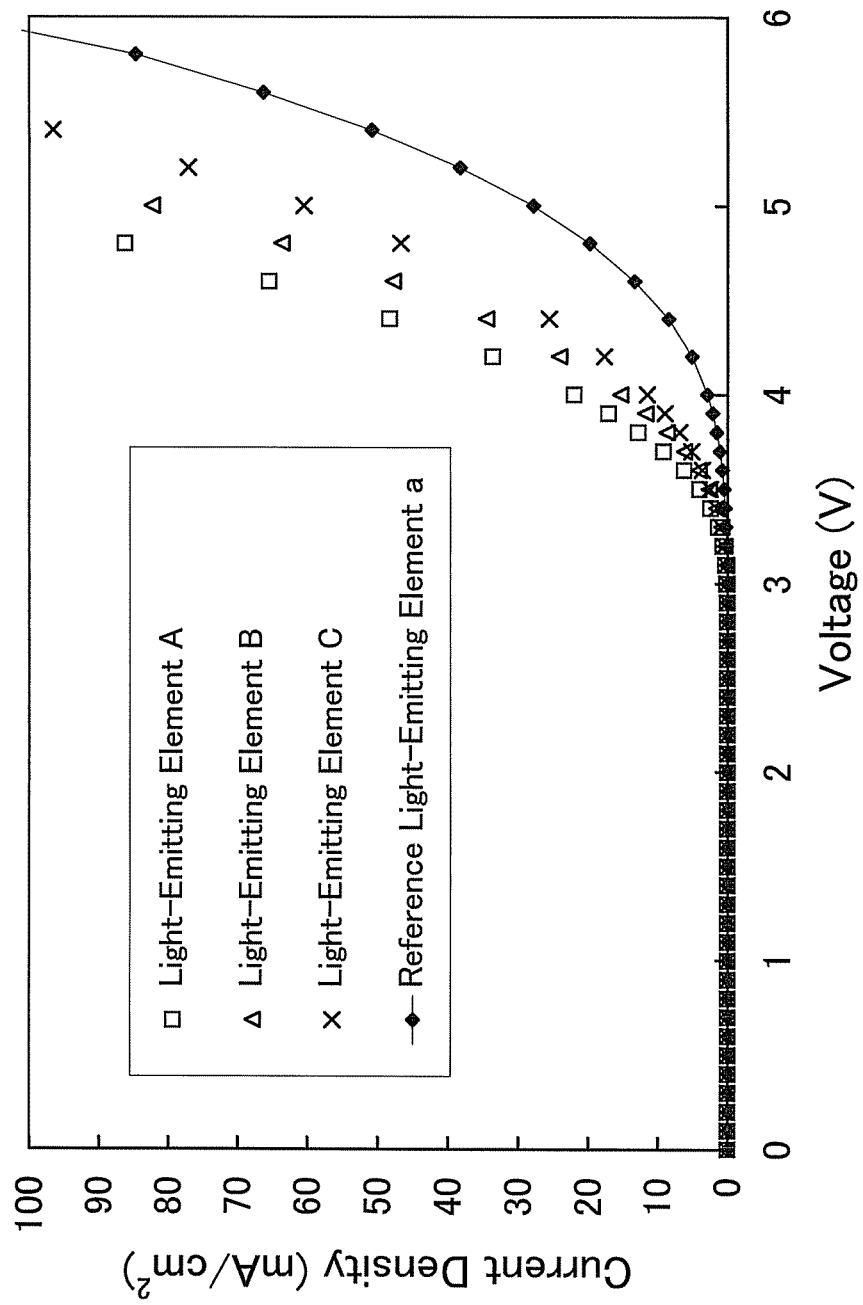
FIG. 13 shows characteristics of light-emitting elements of Example 1.

FIG. 12 shows voltage versus luminance characteristics of Light-Emitting Elements A to C and Reference Light-Emitting Element a, and FIG. 13 shows voltage versus current density characteristics thereof. Table 2 below lists main initial characteristics of each light-emitting element at around 1000 cd/m².

TABLE 2

|  | Voltage (V) | Chromaticity (x, y) | Current Efficiency (cd/A) | External Quantum Efficiency (%) |
|---|---|---|---|---|
| Light-Emitting Element A | 3.7 | (0.29, 0.59) | 12 | 3.6 |
| Light-Emitting Element B | 3.8 | (0.29, 0.60) | 12 | 3.8 |
| Light-Emitting Element C | 3.8 | (0.30, 0.60) | 13 | 3.9 |
| Reference Light-Emitting Element a | 4.4 | (0.29, 0.59) | 12 | 3.7 |

It can be seen from FIG. 12 that, due to the second layer, each of Light-Emitting Elements A to C has a higher luminance at the same voltage than Reference Light-Emitting Element a.

Further, as for the voltage versus current density characteristics shown in FIG. 13, Light-Emitting Elements A to C each have a higher current density at the same voltage than Reference Light-Emitting Element a.

As shown in Table 2, the driving voltages (3.7 V, 3.8 V, and 3.8 V) of Light-Emitting Elements A, B, and C, respectively, are lower than that (4.4 V) of Reference Light-Emitting Element a at around 1000 cd/m². As for the chromaticity, current efficiency, and external quantum efficiency, Light-Emitting Elements A to C are equivalent or almost equivalent to Reference Light-Emitting Element a.

The above-described results reveal that an increase in the driving voltage of the light-emitting element can be suppressed by the second layer.

Example 2

In this example, a light-emitting element according to one embodiment of the present invention will be described. In this example, Light-Emitting Elements D and E each having a 10-nm-thick second layer and Reference Light-Emitting Element b were formed, and comparisons of voltage versus luminance characteristics and voltage versus current density characteristics were made between these elements. As a result, it was shown that Light-Emitting Elements D and E were able to have lower driving voltage than Reference Light-Emitting Element b, which indicated that the second layer had a considerable effect.

In Light-Emitting Element D, VOPc (10 nm) was used for the second layer. In Light-Emitting Element E, SnOPc (10 nm) was used for the second layer. The second layer was not provided in Reference Light-Emitting Element b.

In each of Light-Emitting Elements D and E and Reference Light-Emitting Element b, indium tin oxide containing silicon oxide was used for an anode, aluminum was used for a cathode, NPB and molybdenum oxide were used for a first layer, and lithium oxide ($Li_2O$) was used for a third layer. In the EL layer, NPB and molybdenum oxide were used for the fifth layer, NPB was used for a hole-transport layer, CzPA and 2PCAPA were used for a light-emitting layer, and Alq and BPhen were used for a fourth layer. The structural formulae of materials used in this example are illustrated in Example 1.

(Formation of Light-Emitting Elements D and E and Reference Light-Emitting Element b)

First, indium tin oxide containing silicon or silicon oxide was deposited to a thickness of 110 nm over a glass substrate by a sputtering method to form the anode (the electrode area was 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about $10^{-4}$ Pa, and then, co-evaporation of 4,4'-bis[N-(1-naphthyl)-N-phenylamino]biphenyl (abbreviation: NPB), which is a substance having a hole-transport property, and molybdenum(VI) oxide, which is an acceptor substance, was performed, so that the fifth layer was formed. The thickness thereof was 50 nm, and the mass ratio of NPB to molybdenum(VI) oxide was adjusted to 4:1 (NPB:molybdenum oxide). Note that the co-evaporation method refers to an evaporation method in which evaporation is carried out from evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated so that the mass ratio of CzPA:2PCAPA was 1:0.05 to form the light-emitting layer. CzPA is a substance that has an electron-transport property and 2PCAPA is a substance that emits green light. The thickness of the light-emitting layer was 30 nm.

Next, tris(8-quinolinolato)aluminum (abbreviation: Alq) was deposited to a thickness of 10 nm by an evaporation method using resistance heating and then bathophenanthroline (abbreviation: BPhen) was deposited to a thickness of 10 nm also by an evaporation method using resistance heating, whereby the fourth layer was formed.

Next, lithium oxide ($Li_2O$) was deposited to a thickness of about 0.1 nm by an evaporation method using resistance heating to form the third layer.

Next, each of VOPc and SnOPc was deposited to a thickness of about 10 nm by an evaporation method using resistance heating to form the second layer. VOPc and SnOPc were deposited in Light-Emitting Elements D and E, respectively. In Reference Light-Emitting Element b, the second layer was not provided.

Next, 4,4'-bis[N-(1-naphthyl)-N-phenylamino]biphenyl (abbreviation: NPB), which is a substance having a hole-transport property, and molybdenum(VI) oxide, which is an acceptor substance, were co-evaporated to form the first layer. The thickness thereof was 20 nm, and the mass ratio of NPB to molybdenum(VI) oxide was adjusted to 4:1 (NPB:molybdenum oxide).

Next, aluminum was deposited to a thickness of 200 nm to form the cathode. In this manner, Light-Emitting Elements D and E and Reference Light-Emitting Element b were formed.

Table 3 below shows part of the element structures of Light-Emitting Elements D and E and Reference Light-Emitting Element b. Light-Emitting Elements D and E correspond to the light-emitting element described in any of Embodiments 1, 2, 4, and 5. The structures of the anode, the fifth layer, the hole-transport layer, the light-emitting layer, and the fourth layer are common to Light-Emitting Elements D and E and Reference Light-Emitting Element b, and thus not described here.

TABLE 3

| | Anode | * | The third layer | The second layer | The first layer | Cathode |
|---|---|---|---|---|---|---|
| Light-Emitting Element D | NITO (110 nm) | ** | $Li_2O$ (0.1 nm) | VOPc (10 nm) | NPB:$MoO_x$ (4:1, 20 nm) | Al (200 nm) |
| Light-Emitting Element E | | | | SnOPc (10 nm) | | |
| Reference Light-Emitting Element b | | | | — | | |

* The fifth layer, the hole-transport layer, the light-emitting layer, and the fourth layer are omitted.
** The materials and thicknesses of the layers are omitted.

Light-Emitting Elements D and E and Reference Light-Emitting Element b thus obtained were put into a glove box under a nitrogen atmosphere and the light-emitting elements were sealed so as not to be exposed to atmospheric air. The operation characteristics of these light-emitting elements were measured. The measurements were performed at room temperature (under an atmosphere kept at 25° C.). From each light emitting element, green light at a wavelength of around 520 nm emitted by 2PCAPA, which is a light-emitting substance, was obtained.

Figure 14:
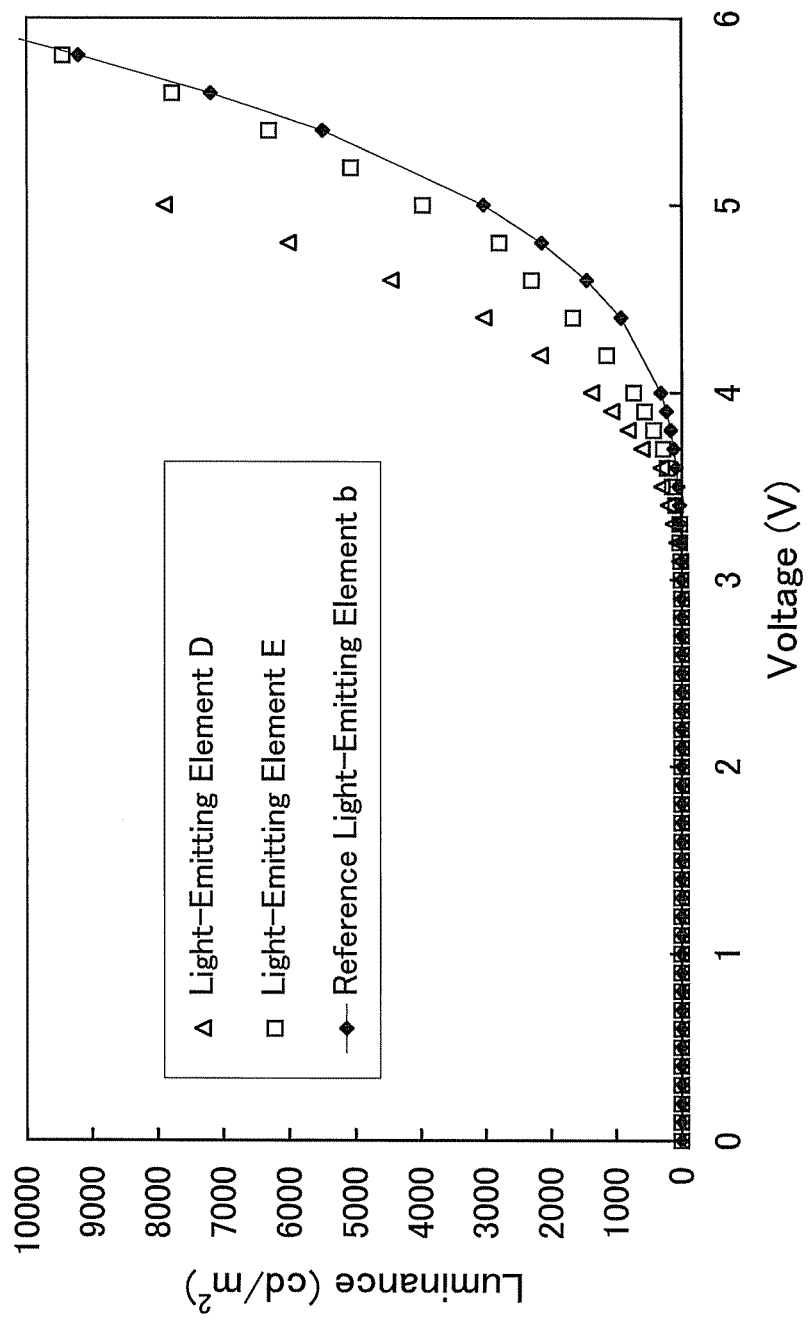
FIG. 14 shows characteristics of light-emitting elements of Example 2.
Figure 15:
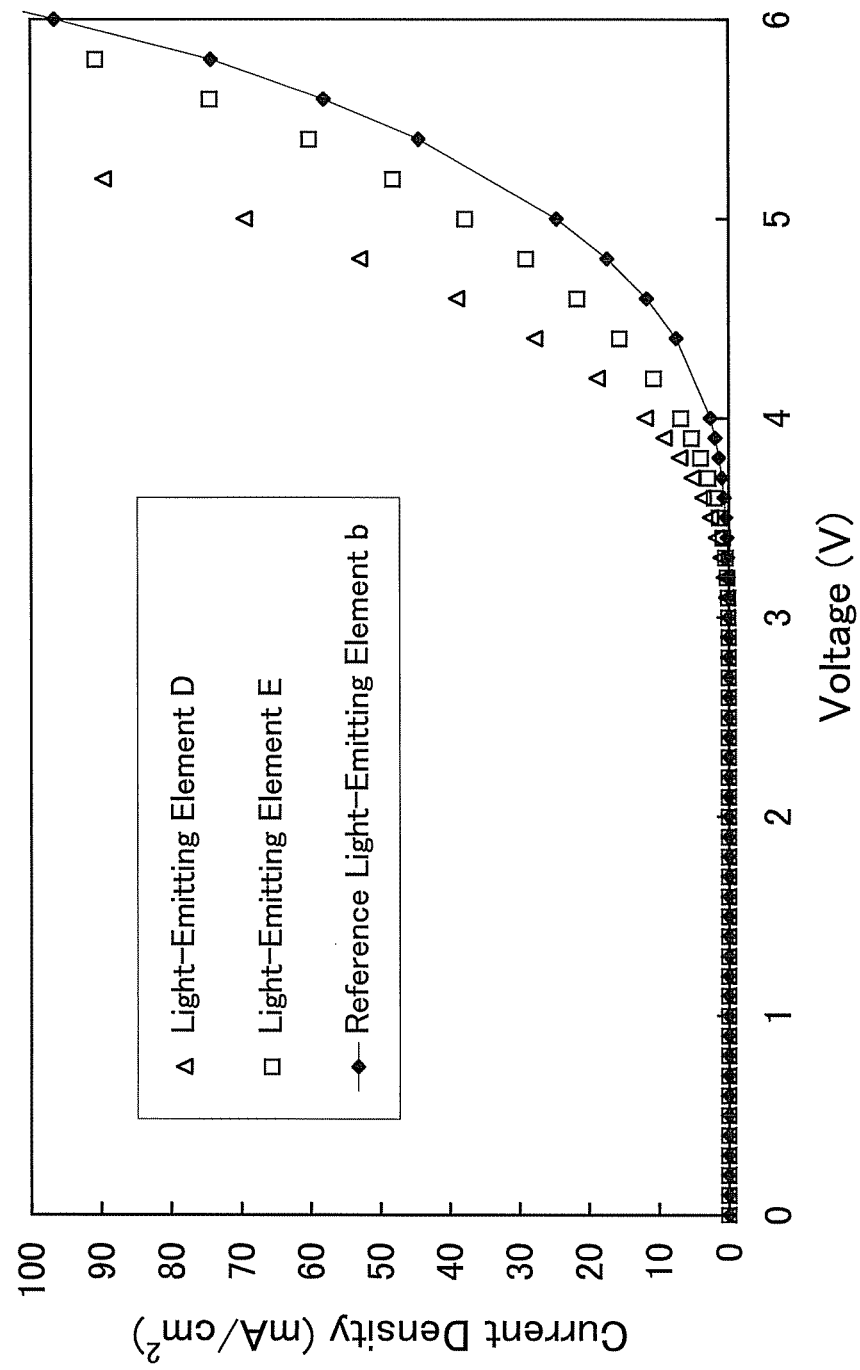
FIG. 15 shows characteristics of light-emitting elements of Example 2.

FIG. 14 shows voltage versus luminance characteristics of Light-Emitting Elements D and E and Reference Light-Emitting Element b, and FIG. 15 shows voltage versus current density characteristics thereof. Table 4 below lists main initial characteristics of each light-emitting element at around 1000 cd/m².

TABLE 4

|  | Voltage (V) | Chromaticity (x, y) | Current Efficiency (cd/A) | External Quantum Efficiency (%) |
| --- | --- | --- | --- | --- |
| Light-Emitting Element D | 3.9 | (0.29, 0.61) | 12 | 3.5 |
| Light-Emitting Element E | 4.1 | (0.29, 0.60) | 11 | 3.3 |
| Reference Light-Emitting Element b | 4.4 | (0.28, 0.60) | 12 | 3.8 |

It can be seen from FIG. 14 that, due to the second layer, each of Light-Emitting Elements D and E has a higher luminance at the same voltage than Reference Light-Emitting Element b.

Further, as for the voltage versus current density characteristics shown in FIG. 15, Light-Emitting Elements D and E each have a higher current density at the same voltage than Reference Light-Emitting Element b.

As shown in Table 4, the driving voltage (3.9 V) of Light-Emitting Element D and that (4.1 V) of Light-Emitting Element E are lower than the driving voltage (4.4 V) of Reference Light-Emitting Element b at around 1000 cd/m². As for the chromaticity, current efficiency, and external quantum efficiency, Light-Emitting Elements D and E are equivalent or almost equivalent to Reference Light-Emitting Element b.

The above-described results reveal that an increase in the driving voltage of the light-emitting element can be suppressed by the second layer even if the second layer has a thickness of 10 nm.

Example 3

This example will demonstrate that electrons are more easily drawn by materials, each of which has a metal-oxygen bond, used for the second layer than by a material which has no metal-oxygen bond. Specifically, Light-Emitting Elements F to H each including a metal complex that has a metal-oxygen bond and an aromatic ligand and Reference Light-Emitting Element c including a metal complex that has an aromatic ligand without a metal-oxygen bond were formed, and comparisons of voltage versus current density characteristics were made between these elements. As a result, it was shown that Light-Emitting Elements F to H were able to have lower driving voltage than Reference Light-Emitting Element c, which indicated that the metal-oxygen bond had a considerable effect.

In Light-Emitting Element F, VOPc (40 nm) was used for the second layer. In Light-Emitting Element G, SnOPc (40 nm) was used for the second layer. In Light-Emitting Element H, TiOPc was used for the second layer. In Reference Light-Emitting Element c, CuPc having the structural formula illustrated below was used for the second layer. While VOPc, SnOPc, and TiOPc are each a metal complex that has a metal-oxygen bond and an aromatic ligand, CuPc is a metal complex that has an aromatic ligand without a metal-oxygen bond.

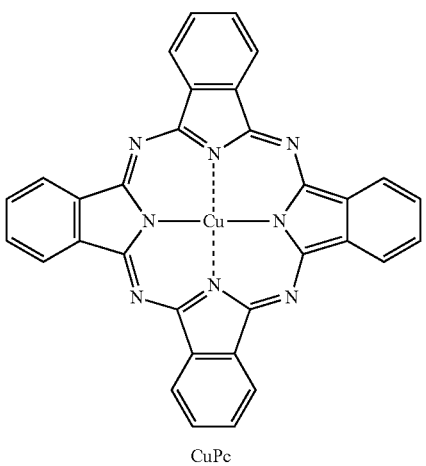

CuPc

In each of Light-Emitting Elements F to H and Reference Light-Emitting Element c, indium tin oxide containing silicon oxide was used for an anode, aluminum was used for a cathode, NPB and molybdenum oxide were used for a first layer, lithium oxide (Li₂O) was used for a third layer, and BPhen was used for a fourth layer.

To confirm the effectiveness of the metal-oxygen bond, a layer including NPB was provided between the first layer and the second layer. Electrons are not easily drawn from the layer including NPB to the layer including CuPc, and accordingly, driving voltage increases.

(Formation of Light-Emitting Elements F to H and Reference Light-Emitting Element c)

First, indium tin oxide containing silicon or silicon oxide was deposited to a thickness of 110 nm over a glass substrate by a sputtering method to form the anode (the electrode area was 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about $10^{-4}$ Pa, and then, bathophenanthroline (abbreviation: BPhen) was deposited to a thickness of 20 nm to form the fourth layer.

Next, lithium oxide (Li₂O) was deposited to a thickness of about 0.1 nm by an evaporation method using resistance heating to form the third layer.

Next, each of VOPc, SnOPc, and TiOPc was deposited to a thickness of about 40 nm by an evaporation method using resistance heating to form the second layer. VOPc, SnOPc, and TiOPc were deposited in Light-Emitting Elements F, G, and H, respectively. In Reference Light-Emitting Element c, CuPc was deposited.

Next, by an evaporation method using resistance heating, 4,4'-bis[N-(1-naphthyl)-N-phenylamino]biphenyl (abbreviation: NPB), which is a substance having a hole-transport property, was deposited to a thickness of 10 nm.

Next, 4,4'-bis[N-(1-naphthyl)-N-phenylamino]biphenyl (abbreviation: NPB), which is a substance having a hole-transport property, and molybdenum(VI) oxide, which is an acceptor substance, were co-evaporated to form the first layer. The thickness thereof was 20 nm, and the mass ratio of NPB to molybdenum(VI) oxide was adjusted to 4:1 (NPB:molybdenum oxide).

Next, aluminum was deposited to a thickness of 200 nm to form the cathode. In this manner, Light-Emitting Elements F to H and Reference Light-Emitting Element c were formed.

Table 5 below shows part of the element structures of Light-Emitting Elements F to H and Reference Light-Emitting Element c.

TABLE 5

| | Anode | The fourth layer | The third layer | The second layer | NPB layer | The first layer | Cathode |
|---|---|---|---|---|---|---|---|
| Light-Emitting Element F | NITO (110 nm) | BPhen (20 nm) | Li$_2$O (0.1 nm) | VOPc (40 nm) | NPB (10 nm) | NPB:MoO$_x$ (4:1, 20 nm) | Al (200 nm) |
| Light-Emitting Element G | | | | SnOPc (40 nm) | | | |
| Light-Emitting Element H | | | | TiOPc (40 nm) | | | |
| Reference Light-Emitting Element c | | | | CuPc (40 nm) | | | |

The Light-Emitting Elements F to H and Reference Light-Emitting Element c thus obtained were put into a glove box under a nitrogen atmosphere and the light-emitting elements were sealed so as not to be exposed to atmospheric air. The operation characteristics of these Elements were measured. The measurements were performed at room temperature (under an atmosphere kept at 25° C.).

Figure 16:
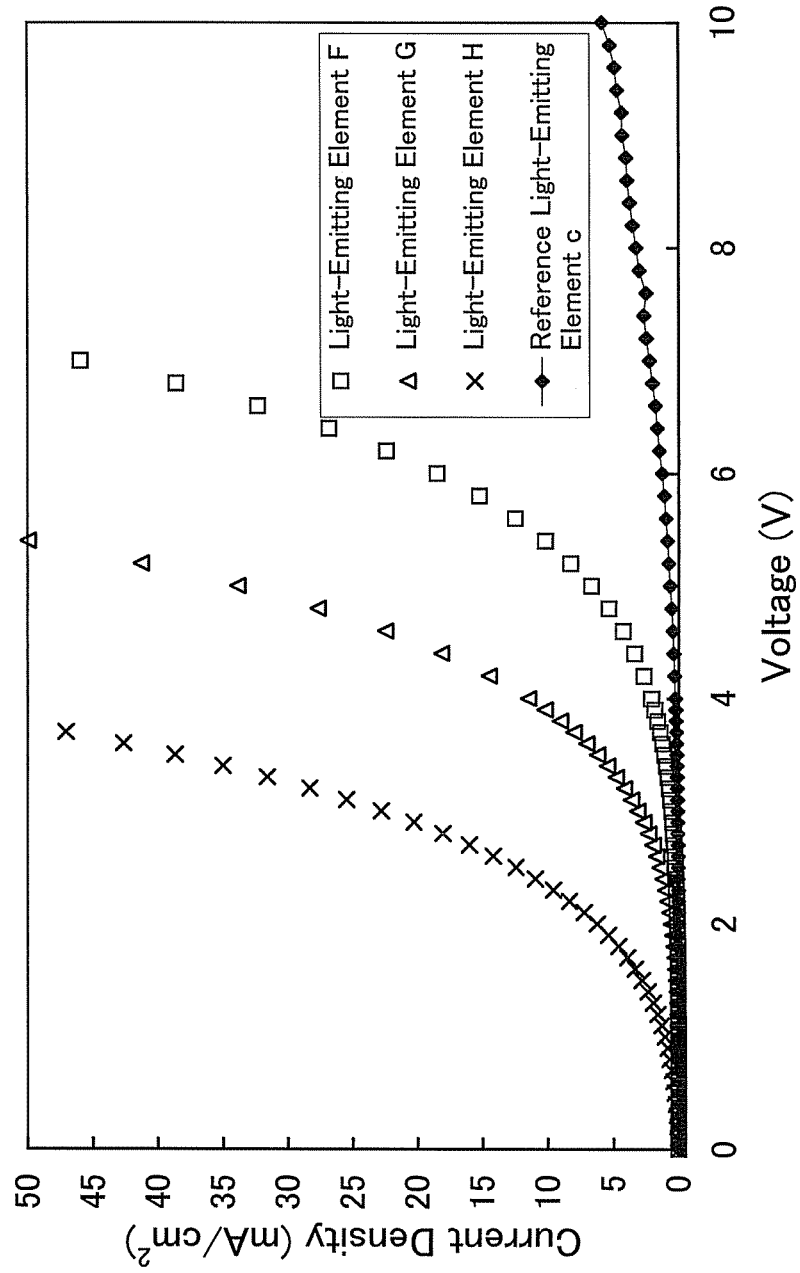
FIG. 16 shows characteristics of light-emitting elements of Example 3.

FIG. 16 shows the voltage versus current density characteristics of Light-Emitting Elements F to G and Reference Light-Emitting Element c. At the same voltage, Light-Emitting Elements F to G were found to have a higher current density than Reference Light-Emitting Element c. It was thus shown that electrons are drawn from NPB more easily by VOPc, SnOPc, and TiOPc, each of which has a metal-oxygen bond, than by CuPc, which has no metal-oxygen bond.

Even if the concentration of molybdenum oxide in the first layer is low and electrons are difficult to draw from the first layer, an increase in the driving voltage of a light-emitting element can be expected to be suppressed.

Example 4

In this example, a light-emitting element according to one embodiment of the present invention will be described. In this example, Light-Emitting Element I and Reference Light-Emitting Element d were formed, and comparisons of voltage versus luminance characteristics and voltage versus current density characteristics were made between these elements. As a result, it was shown that Light-Emitting Element I was able to have lower driving voltage than Reference Light-Emitting Element d, which indicated that the second layer provided in Light-Emitting Element I had a considerable effect.

In Light-Emitting Element I, VOPc was used for the second layer. The second layer was not provided in Reference Light-Emitting Element d.

In each of Light-Emitting Element I and Reference Light-Emitting Element d, indium tin oxide containing silicon oxide was used for an anode, aluminum was used for a cathode, NPB and molybdenum oxide were used for a first layer, and BPhen and Ca were used for a third layer. In the EL layer, NPB and molybdenum oxide were used for the fifth layer, NPB was used for a hole-transport layer, CzPA and 2PCAPA were used for a light-emitting layer, and BPhen was used for a fourth layer. The structural formulae of materials used in this example are illustrated in Example 1 and thus omitted here.

(Formation of Light-Emitting Element I and Reference Light-Emitting Element d)

First, indium tin oxide containing silicon or silicon oxide was deposited to a thickness of 110 nm over a glass substrate by a sputtering method to form the anode (the electrode area was 2 mm×2 min).

Next, the glass substrate provided with the anode was fixed to a substrate holder provided in a deposition chamber in a vacuum evaporation apparatus such that the side on which the anode was formed faced downward. The vacuum evaporation apparatus was evacuated to about $10^{-4}$ Pa, and then, co-evaporation of 4,4'-bis[N-(1-naphthyl)-N-phenylamino]biphenyl (abbreviation: NPB), which is a substance having a high hole-transport property, and molybdenum(VI) oxide, which is an acceptor substance, was performed, so that the fifth layer was formed. The thickness thereof was 50 nm, and the mass ratio of NPB to molybdenum(VI) oxide was adjusted to 4:1 (NPB:molybdenum oxide). Note that the co-evaporation method refers to an evaporation method in which evaporation is carried out from evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated so that the mass ratio of CzPA:2PCAPA was 1:0.05 to form the light-emitting layer. CzPA is a substance that has an electron-transport property and 2PCAPA is a substance that emits green light. The thickness of the light-emitting layer was 20 nm.

Next, by an evaporation method using resistance heating, bathophenanthroline (abbreviation: BPhen) was deposited to a thickness of 10 nm, whereby the fourth layer was formed.

Next, Bphen and Ca were co-evaporated to form the third layer. The thickness thereof was 10 nm and the mass ratio of BPhen to Ca was adjusted to 1:0.1 (=BPhen:Ca).

Then, VOPc was deposited to a thickness of about 2 nm by an evaporation method using resistance heating to form the second layer. VOPc was deposited in Light-Emitting Element I, and the second layer was not formed in Reference Light-Emitting Element d.

Next, 4,4'-bis[N-(1-naphthyl)-N-phenylamino]biphenyl (abbreviation: NPB), which is a substance having a high hole-transport property, and molybdenum(VI) oxide, which is an acceptor substance, were co-evaporated to form the first layer. The thickness thereof was 20 nm, and the mass ratio of NPB to molybdenum(VI) oxide was adjusted to 4:1 (NPB: molybdenum oxide).

Next, aluminum was deposited to a thickness of 200 nm to form the cathode. In this manner, Light-Emitting Element I and Reference Light-Emitting Element d were formed.

Table 6 below shows part of the element structures of Light-Emitting Element I and Reference Light-Emitting Element d. Light-Emitting Element I corresponds to the light-emitting element described in any of Embodiments 1, 2, 4, and 5. The structures of the anode, the fifth layer, the hole-transport layer, the light-emitting layer, and the fourth layer are common to Light-Emitting Element I and Reference Light-Emitting Element d, and thus not described here.

that the second layer provided in each of Light-Emitting Elements J and K had a considerable effect.

TABLE 6

|  | Anode | * | The third layer | The second layer | The first layer | Cathode |
| --- | --- | --- | --- | --- | --- | --- |
| Light-Emitting Element I | NITO (110 nm) | ** | BPhen:Ca (1:0.1, 10 nm) | VOPc (2 nm) | NPB:MoO$_x$ (4:1, 20 nm) | Al (200 nm) |
| Reference Light-Emitting Element d |  |  |  | — |  |  |

* The fifth layer, the hole-transport layer, the light-emitting layer, and the fourth layer are omitted.
** The materials and thicknesses of the layers are omitted.

Light-Emitting Element I and Reference Light-Emitting Element d thus obtained were put into a glove box under a nitrogen atmosphere and the light-emitting elements were sealed so as not to be exposed to atmospheric air. The operation characteristics of these light-emitting elements were measured. The measurements were performed at room temperature (under an atmosphere kept at 25° C.). From each light emitting element, green light at a wavelength of around 520 nm emitted by 2PCAPA, which is a light-emitting substance, was obtained.

Figure 17:
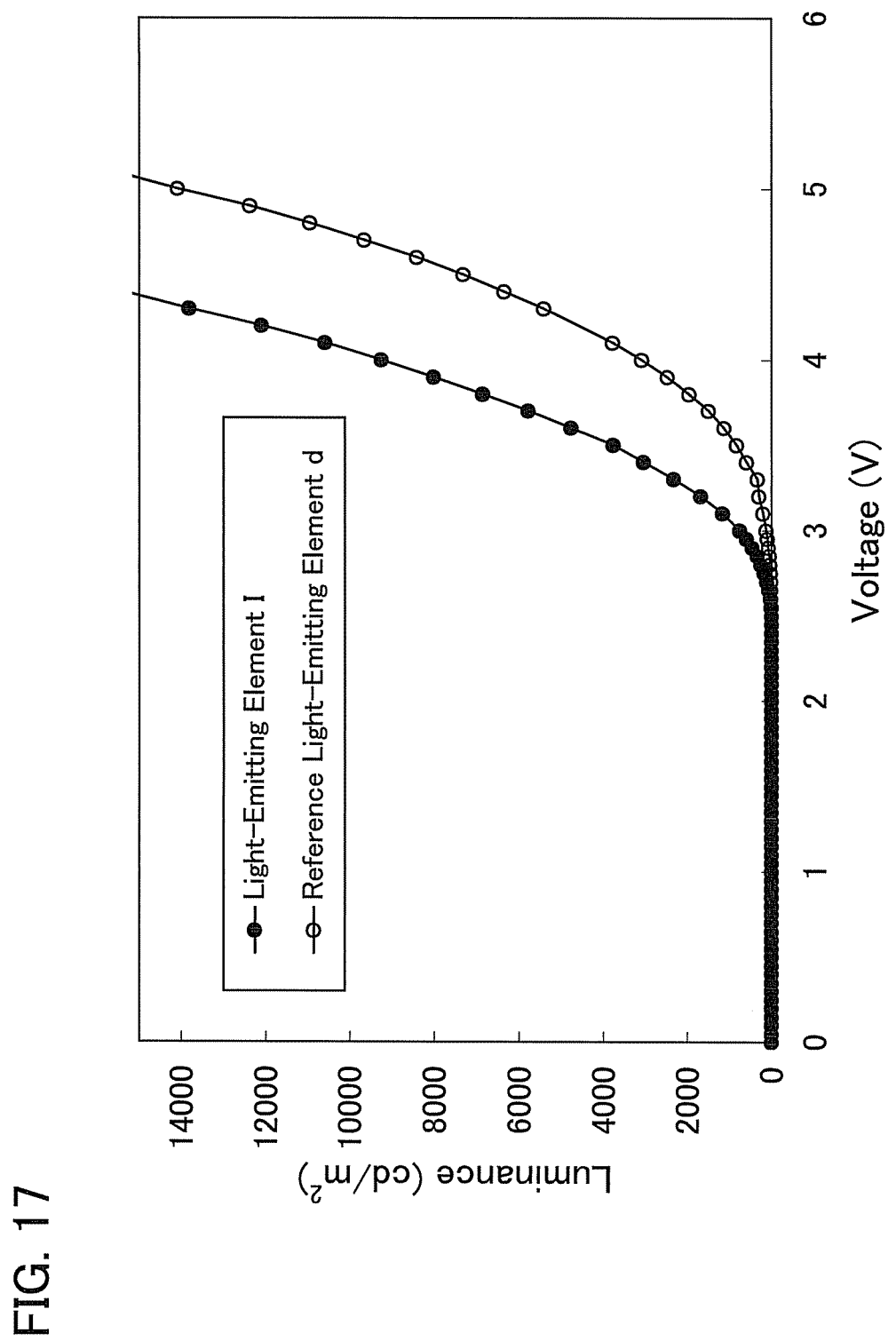
FIG. 17 shows characteristics of light-emitting elements of Example 4.
Figure 18:
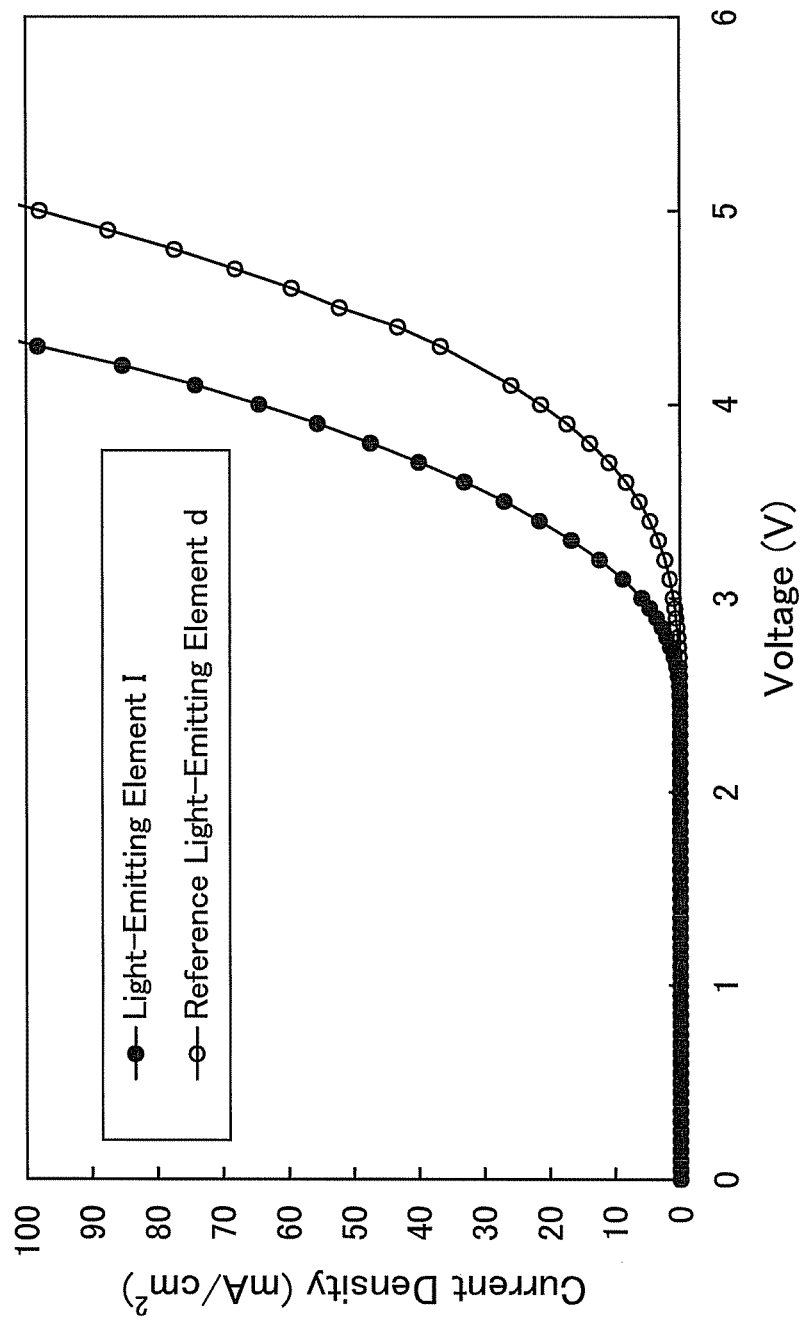
FIG. 18 shows characteristics of light-emitting elements of Example 4.

FIG. 17 shows voltage versus luminance characteristics of Light-Emitting Element I and Reference Light-Emitting Element d, and FIG. 18 shows voltage versus current density characteristics thereof. Table 7 below lists main initial characteristics of each light-emitting element at around 1000 cd/m$^2$.

TABLE 7

|  | Voltage (V) | Chromaticity (x, y) | Current Efficiency (cd/A) | External Quantum Efficiency (%) |
| --- | --- | --- | --- | --- |
| Light-Emitting Element I | 3.1 | (0.27, 0.61) | 13 | 4.1 |
| Reference Light-Emitting Element d | 3.6 | (0.27, 0.61) | 14 | 4.1 |

It can be seen from FIG. 17 that, due to the second layer, Light-Emitting Element I has a higher luminance at the same voltage than Reference Light-Emitting Element d.

Further, as for the voltage versus current density characteristics shown in FIG. 18, Light-Emitting Element I has a higher current density at the same voltage than Reference Light-Emitting Element d.

As shown in Table 7, the driving voltage (3.1 V) of Light-Emitting Element I is lower than that (3.6 V) of Reference Light-Emitting Element d at around 1000 cd/m$^2$. As for the chromaticity, current efficiency, and external quantum efficiency, Light-Emitting Element I is equivalent or almost equivalent to Reference Light-Emitting Element d.

The above-described results reveal that an increase in the driving voltage of the light-emitting element can be suppressed by the second layer.

Example 5

In this example, a light-emitting element according to one embodiment of the present invention will be described. In this example, Light-Emitting Elements J and K and Reference Light-Emitting Elements e and f were formed, and comparisons of voltage versus luminance characteristics and voltage versus current density characteristics were made between these elements. As a result, it was shown that Light-Emitting Elements J and K were able to have lower driving voltage than Reference Light-Emitting Elements e and f, which indicated In each of Light-Emitting Elements J and K, VOPc was used for the second layer. The second layer was not provided in each of Reference Light-Emitting Elements e and f.

In each of Light-Emitting Elements J and K and Reference Light-Emitting Elements e and f, indium tin oxide containing silicon oxide was used for an anode, aluminum was used for a cathode, PCzPA and molybdenum oxide were used for a first layer, and Li$_2$O was used for a third layer. In the EL layer, NPB and molybdenum oxide were used for the fifth layer, NPB was used for a hole-transport layer, CzPA and 2PCAPA were used for a light-emitting layer, and a stack of BPhen and Alq was used for a fourth layer. The structural formulae of materials used in this example are illustrated in Example 1 and thus omitted here.

(Formation of Light-Emitting Elements J and K and Reference Light-Emitting Elements e and f)

First, indium tin oxide containing silicon or silicon oxide was deposited to a thickness of 110 nm over a glass substrate by a sputtering method to form the anode (the electrode area was 2 mm×2 mm).

Next, the glass substrate provided with the anode was fixed to a substrate holder provided in a deposition chamber in a vacuum evaporation apparatus such that the side on which the anode was formed faced downward. The vacuum evaporation apparatus was evacuated to about 10$^{-4}$ Pa, and then, co-evaporation of 4,4'-bis[N-(1-naphthyl)-N-phenylamino]biphenyl (abbreviation: NPB), which is a substance having a high hole-transport property, and molybdenum(VI) oxide, which is an acceptor substance, was performed, so that the fifth layer was formed. The thickness thereof was 50 nm, and the mass ratio of NPB to molybdenum(VI) oxide was adjusted to 4:1 (NPB:molybdenum oxide). Note that the co-evaporation method refers to an evaporation method in which evaporation is carried out from evaporation sources at the same time in one process chamber.

Next, NPB was deposited to a thickness of 10 nm by an evaporation method using resistance heating to form the hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated so that the mass ratio of CzPA:2PCAPA was 1:0.05 to form the light-emitting layer. CzPA is a substance that has an electron-transport property and 2PCAPA is a substance that emits green light. The thickness of the light-emitting layer was 20 nm.

Next, tris(8-quinolinolato)aluminum (abbreviation: Alq) was deposited to a thickness of 10 nm by an evaporation method using resistance heating and then bathophenanthroline (abbreviation: BPhen) was deposited to a thickness of 10 nm also by an evaporation method using resistance heating, whereby the fourth layer was formed.

Next, lithium oxide (Li$_2$O) was deposited to a thickness of about 0.1 nm by an evaporation method using resistance heating to form the third layer.

Then, VOPc was deposited to a thickness of about 2 nm by an evaporation method using resistance heating to form the second layer. VOPc was deposited in each of Light-Emitting Elements J and K, and the second layer was not formed in each of Reference Light-Emitting Elements e and f.

Next, 4,4'-bis[N-(1-naphthyl)-N-phenylamino]biphenyl (abbreviation: NPB), which is a substance having a high hole-transport property, and molybdenum(VI) oxide, which is an acceptor substance, were co-evaporated to form the first layer. The thickness thereof was 20 nm. The mass ratio of NPB to molybdenum(VI) oxide was adjusted to 4:0.5 (NPB: molybdenum oxide) in each of Light-Emitting Element J and Reference Light-Emitting Element e, and adjusted to 4:1 (NPB:molybdenum oxide) in each of Light-Emitting Element K and Reference Light-Emitting Element f.

Next, aluminum was deposited to a thickness of 200 nm to form the cathode. In this manner, Light-Emitting Elements J and K and Reference Light-Emitting Elements e and f were formed.

Table 8 below shows part of the element structures of Light-Emitting Elements J and K and Reference Light-Emitting Elements e and f. Light-Emitting Elements J and K correspond to the light-emitting element described in any of Embodiments 1, 2, 4, and 5. The structures of the anode, the fifth layer, the hole-transport layer, the light-emitting layer, and the fourth layer are common to Light-Emitting Elements J and K and Reference Light-Emitting Elements e and f, and thus not described here.

TABLE 8

|  | Anode | * | The third layer | The second layer | The first layer | Cathode |
|---|---|---|---|---|---|---|
| Light-Emitting Element J | NITO (110 nm) | ** | Li$_2$O (0.1 nm) | VOPc (2 nm) | PCzPA:MoO$_x$ (4:0.5, 20nm) | Al (200 nm) |
| Light-Emitting Element K |  |  |  | VOPc (2 nm) | PCzPA:MoO$_x$ (4:1, 20 nm) |  |
| Reference Light-Emitting Element e |  |  |  | — | PCzPA:MoO$_x$ (4:0.5, 20 nm) |  |
| Reference Light-Emitting Element f |  |  |  | — | PCzPA:MoO$_x$ (4:1, 20 nm) |  |

* The fifth layer, the hole-transport layer, the light-emitting layer, and the fourth layer are omitted.
** The materials and thicknesses of the layers are omitted.

Light-Emitting Elements J and K and Reference Light-Emitting Elements e and f thus obtained were put into a glove box under a nitrogen atmosphere and the light-emitting elements were sealed so as not to be exposed to atmospheric air. The operation characteristics of these light-emitting elements were measured. The measurements were performed at room temperature (under an atmosphere kept at 25° C.). From each light emitting element, green light at a wavelength of around 520 nm emitted by 2PCAPA, which is a light-emitting substance, was obtained.

Figure 19:
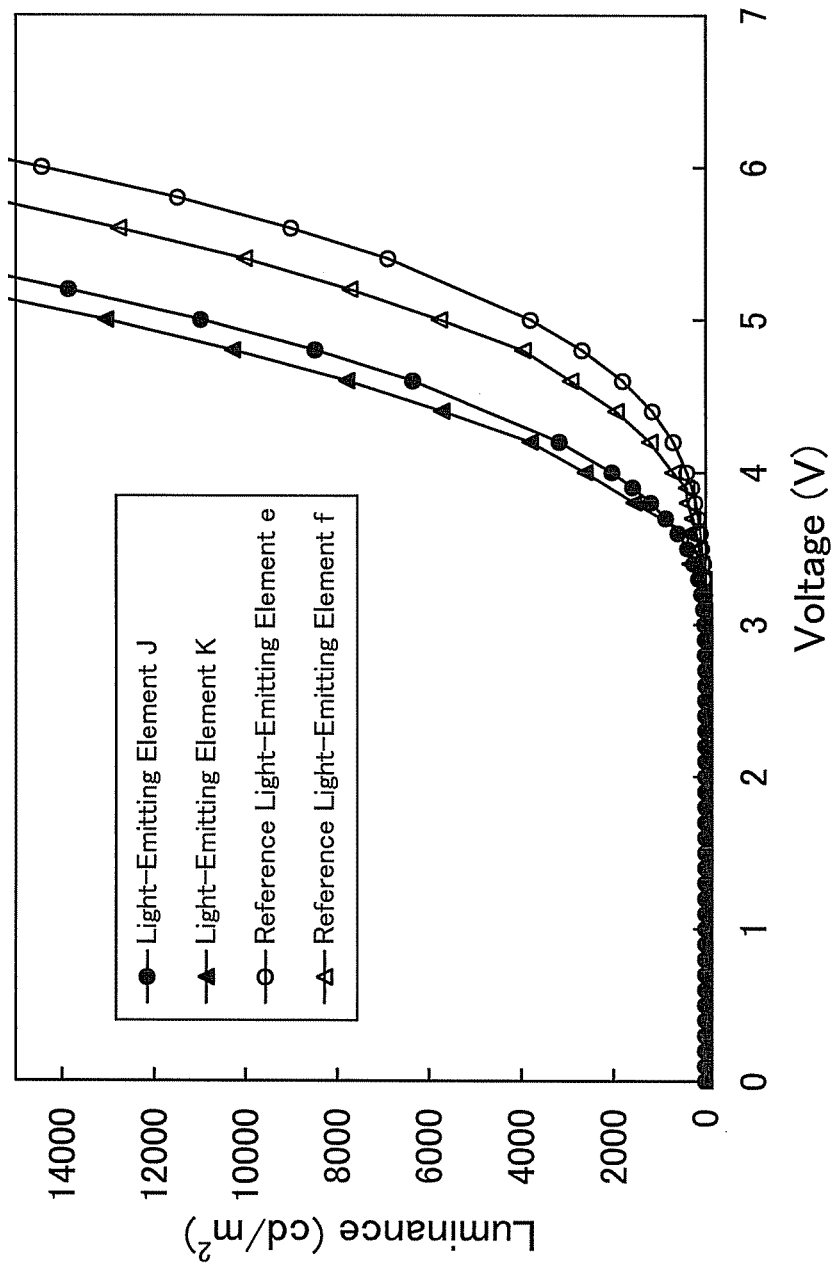
FIG. 19 shows characteristics of light-emitting elements of Example 5.
Figure 20:
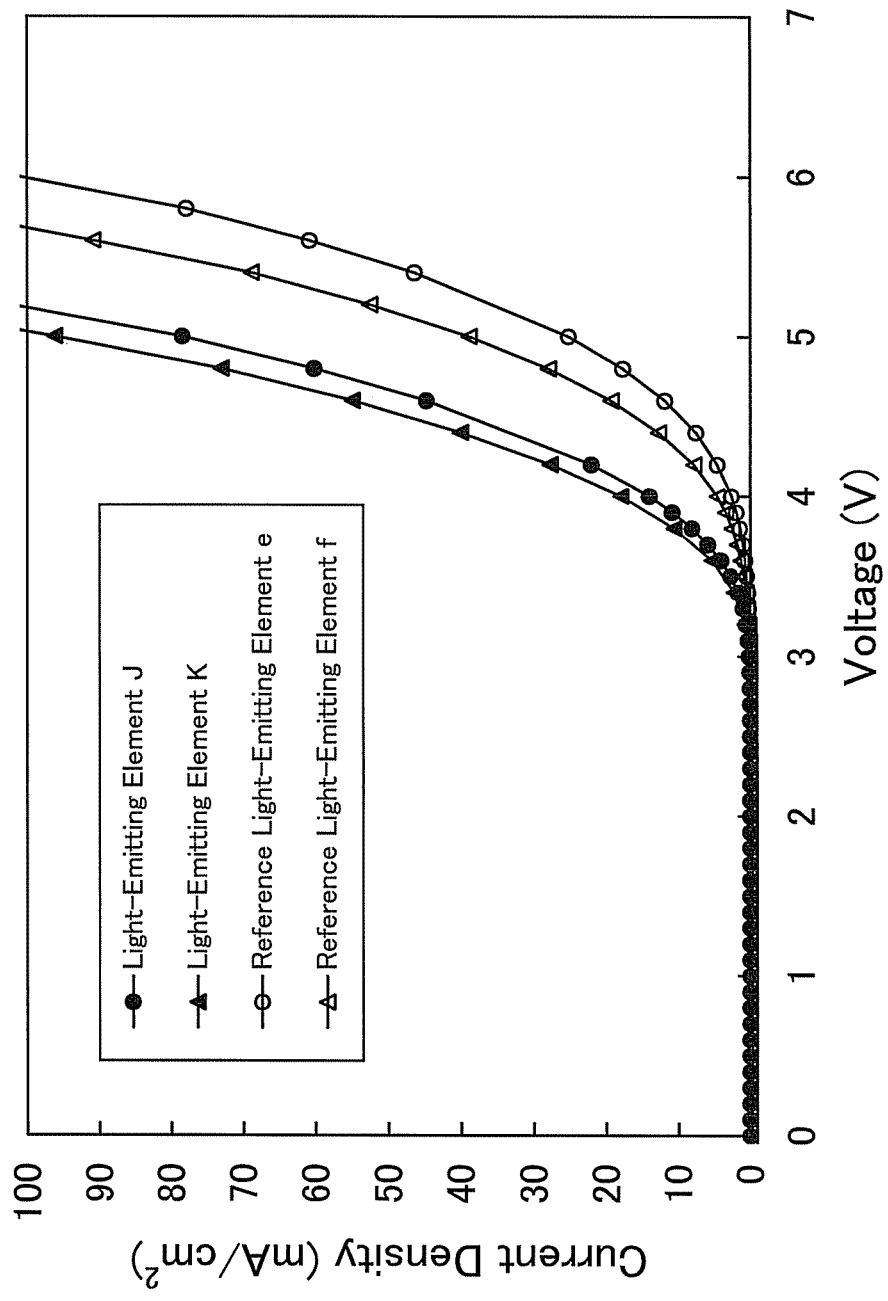
FIG. 20 shows characteristics of light-emitting elements of Example 5.

FIG. 19 shows voltage versus luminance characteristics of Light-Emitting Elements J and K and Reference Light-Emitting Elements e and f, and FIG. 20 shows voltage versus current density characteristics thereof. Table 9 below lists main initial characteristics of each light-emitting element at around 1000 cd/m$^2$.

TABLE 9

|  | Voltage (V) | Chromaticity (x, y) | Current Efficiency (cd/A) | External Quantum Efficiency (%) |
|---|---|---|---|---|
| Light-Emitting Element J | 3.7 | (0.30, 0.61) | 15 | 4.3 |
| Light-Emitting Element K | 3.8 | (0.31, 0.61) | 15 | 4.3 |

TABLE 9-continued

|  | Voltage (V) | Chromaticity (x, y) | Current Efficiency (cd/A) | External Quantum Efficiency (%) |
|---|---|---|---|---|
| Reference Light-Emitting Element e | 4.4 | (0.31, 0.61) | 15 | 4.5 |
| Reference Light-Emitting Element f | 4.2 | (0.31, 0.61) | 15 | 4.5 |

It can be seen from FIG. 19 that, due to the second layer, Light-Emitting Elements J and K have a higher luminance at the same voltage than Reference Light-Emitting Elements e and f.

Further, as for the voltage versus current density characteristics shown in FIG. 20, Light-Emitting Elements J and K each have a higher current density at the same voltage than Reference Light-Emitting Elements e and f.

As shown in Table 9, the driving voltage (3.7 V) of Light-Emitting Element J and that (3.8 V) of Light-Emitting Element K are lower than the driving voltage (4.4 V) of Reference Light-Emitting Element e and that (4.2 V) of Reference Light-Emitting Element f, at around 1000 cd/m$^2$. As for the chromaticity, current efficiency, and external quantum efficiency, Light-Emitting Elements J and K are equivalent or almost equivalent to Reference Light-Emitting Elements e and f.

In this example, the concentration of molybdenum oxide in the first layer is lower in Light-Emitting Element J and Reference Light-Emitting Element e than in Light-Emitting Element K and Reference Light-Emitting Element f. Nevertheless, comparisons of the results in Table 9 between Light-Emitting Element J and Reference Light-Emitting Element e and between Light-Emitting Element K and Reference Light-Emitting Element f revealed equal effectiveness.

The above-described results reveal that an increase in the driving voltage of the light-emitting element can be suppressed by the second layer.

Example 6

In this example, a light-emitting element according to one embodiment of the present invention will be described. In this example, Light-Emitting Element L and Reference Light-Emitting Element g were formed, and comparisons of voltage versus luminance characteristics and voltage versus current density characteristics were made between these elements. As a result, it was shown that Light-Emitting Element L were able to have lower driving voltage than Reference Light-Emitting Element g, which indicated that the second layer provided in Light-Emitting Element L had a considerable effect.

VOPc was used for the second layer in Light-Emitting Element L, and the second layer was not provided in Reference Light-Emitting Element g.

In Light-Emitting Element L and Reference Light-Emitting Element g, indium tin oxide containing silicon oxide was used for a cathode, aluminum was used for an anode, NPB and molybdenum oxide were used for a first layer, and Bphen and Li were used for a third layer. In the EL layer, NPB and molybdenum oxide were used for the fifth layer, NPB was used for a hole-transport layer, CzPA and 2PCAPA were used for a light-emitting layer, and Alq was used for a fourth layer. The structural formulae of materials used in this example are illustrated in Example 1 and thus omitted here.

(Formation of Light-Emitting Element L and Reference Light-Emitting Element g)

First, indium tin oxide containing silicon or silicon oxide was deposited to a thickness of 110 nm over a glass substrate by a sputtering method to form the cathode (the electrode area was 2 mm×2 mm).

Next, the glass substrate provided with the cathode was fixed to a substrate holder provided in a deposition chamber in a vacuum evaporation apparatus such that the side on which the cathode was formed faced downward. The vacuum evaporation apparatus was evacuated to about $10^{-4}$ Pa, and then, co-evaporation of 4,4'-bis[N-(1-naphthyl)-N-phenylamino]biphenyl (abbreviation: NPB), which is a substance having a high hole-transport property, and molybdenum(VI) oxide, which is an acceptor substance, was performed, so that the first layer was formed. The thickness of the fifth layer was 60 nm, and the mass ratio of NPB to molybdenum(VI) oxide was adjusted to 4:1 (NPB:molybdenum oxide). Note that the co-evaporation method refers to an evaporation method in which evaporation is carried out from evaporation sources at the same time in one process chamber.

Then, VOPc was deposited to a thickness of about 2 mm by an evaporation method using resistance heating to form the second layer. VOPc was deposited in Light-Emitting Element L, and the second layer was not formed in Reference Light-Emitting Element g.

Next, Bphen and Li were co-evaporated to form the third layer. The thickness thereof was 10 nm and the mass ratio of BPhen to Li was adjusted to 1:0.02 (=BPhen:Li).

Next, tris(8-quinolinolato)aluminum (abbreviation: Alq) was deposited to a thickness of 10 nm by an evaporation method using resistance heating to form the fourth layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated so that the mass ratio of CzPA:2PCAPA was 1:0.05 to form the light-emitting layer. CzPA is a substance that has an electron-transport property and 2PCAPA is a substance that emits green light. The thickness of the light-emitting layer was 30 nm.

Then, NPB was deposited to a thickness of 10 nm by an evaporation method using resistance heating to form the hole-transport layer.

Next, 4,4'-bis[N-(1-naphthyl)-N-phenylamino]biphenyl (abbreviation: NPB), which is a substance having a high hole-transport property, and molybdenum(VI) oxide, which is an acceptor substance, were co-evaporated to form the fifth layer. The thickness thereof was 30 nm, and the mass ratio of NPB to molybdenum(VI) oxide was adjusted to 4:1 (NPB:molybdenum oxide).

Next, aluminum was deposited to a thickness of 200 nm to form the anode. In this manner, Light-Emitting Element L and Reference Light-Emitting Element g were formed.

Table 10 below shows part of the element structures of Light-Emitting Element L and Reference Light-Emitting Element g. Light-Emitting Element L corresponds to the light-emitting element described in any of Embodiments 1, 2, 4, and 5. The structures of the anode, the fifth layer, the hole-transport layer, the light-emitting layer, and the fourth layer are common to Light-Emitting Element L and Reference Light-Emitting Element g, and thus not described here.

TABLE 10

|  | Cathode | The first layer | The second layer | The third layer | * | Anode |
|---|---|---|---|---|---|---|
| Light-Emitting Element L | NITO (110 nm) | NPB:MoO$_x$ (4:1, 60 nm) | VOPc (2 nm) | BPhen:Li (1:0.02, 10 nm) | ** | Al (200 nm) |
| Reference Light-Emitting Element g |  |  | — |  |  |  |

* The fifth layer, the hole-transport layer, the light-emitting layer, and the fourth layer are omitted.
** The materials and thicknesses of the layers are omitted.

Light-Emitting Element L and Reference Light-Emitting Element g thus obtained were put into a glove box under a nitrogen atmosphere and the light-emitting elements were sealed so as not to be exposed to atmospheric air. The operation characteristics of these light-emitting elements were measured. The measurements were performed at room temperature (under an atmosphere kept at 25° C.). From each light emitting element, green light at a wavelength of around 520 nm emitted by 2PCAPA, which is a light-emitting substance, was obtained.

Figure 21:
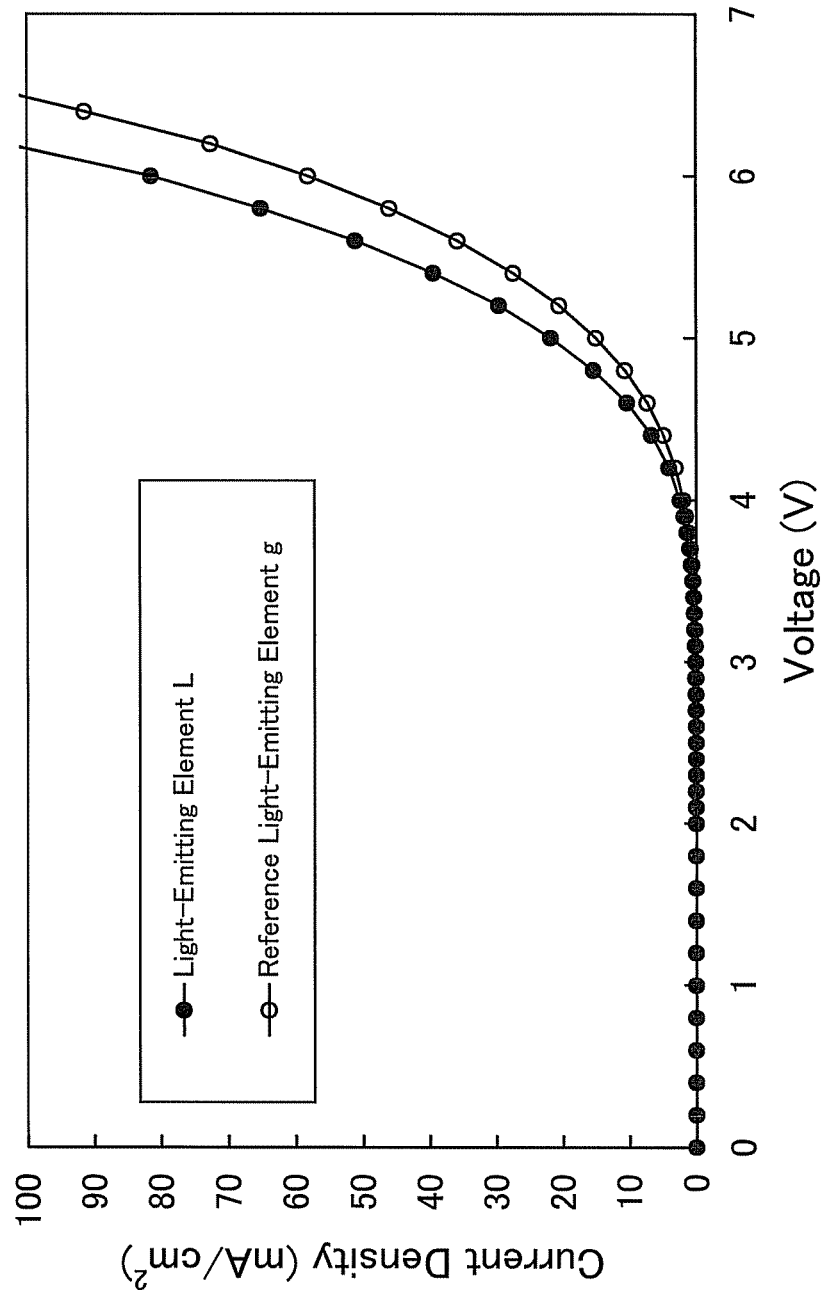
FIG. 21 shows characteristics of light-emitting elements of Example 6.

FIG. 21 shows and voltage versus current density characteristics of Light-Emitting Element L and Reference Light-Emitting Element g. Table 11 below lists main initial characteristics of each light-emitting element at around 1000 cd/m$^2$.

TABLE 11

|  | Voltage (V) | Chromaticity (x, y) | Current Efficiency (cd/A) | External Quantum Efficiency (%) |
|---|---|---|---|---|
| Light-Emitting Element L | 4.4 | (0.24, 0.61) | 15 | 5.0 |
| Reference Light-Emitting Element g | 4.6 | (0.24, 0.61) | 15 | 5.0 |

It can be seen from FIG. 21 that, due to the second layer, Light-Emitting Element L has a higher current density at the same voltage than Reference Light-Emitting Element g.

As shown in Table 11, the driving voltage (4.4 V) of Light-Emitting Element L is lower than that (4.6 V) of Reference Light-Emitting Element g at around 1000 cd/m$^2$. As for the chromaticity, current efficiency, and external quantum efficiency, Light-Emitting Element L is equivalent or almost equivalent to Reference Light-Emitting Element g.

The above-described results reveal that an increase in the driving voltage of the light-emitting element can be suppressed by the second layer.

This application is based on Japanese Patent Application serial no. 2010-066296 filed with the Japan Patent Office on Mar. 23, 2010, the entire contents of which are hereby incorporated by reference.

What is claimed is:

1. A light-emitting element comprising:
   an electroluminescence layer between an anode and a cathode;
   a first layer between the cathode and the electroluminescence layer, the first layer including a substance having a hole-transport property;
   a second layer between the cathode and the electroluminescence layer, the second layer consisting essentially of a metal complex having a metal-oxygen double bond and an aromatic ligand; and
   a third layer between the cathode and the electroluminescence layer, the third layer including one of an alkali metal, an alkaline-earth metal, a rare-earth metal, an alkali metal compound, an alkaline-earth metal compound, and a rare-earth metal compound,
   wherein the first layer is provided between the cathode and the second layer and in contact with the cathode and with the second layer,
   wherein the second layer is provided between the first layer and the third layer and in contact with the first layer and with the third layer, and
   wherein the third layer is provided between the second layer and the electroluminescence layer and in contact with the second layer and with the electroluminescence layer.

2. The light-emitting element according to claim 1, wherein the metal complex is a phthalocyanine-based material.

3. The light-emitting element according to claim 2, wherein the phthalocyanine-based material is represented by any of structural formulae below:

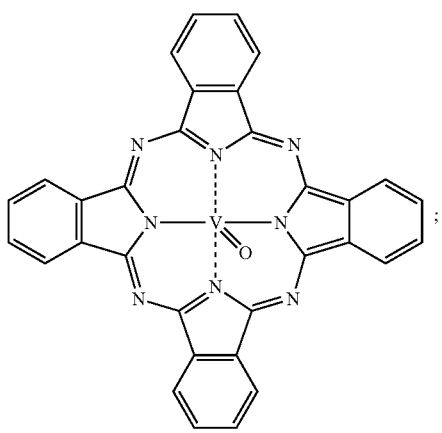

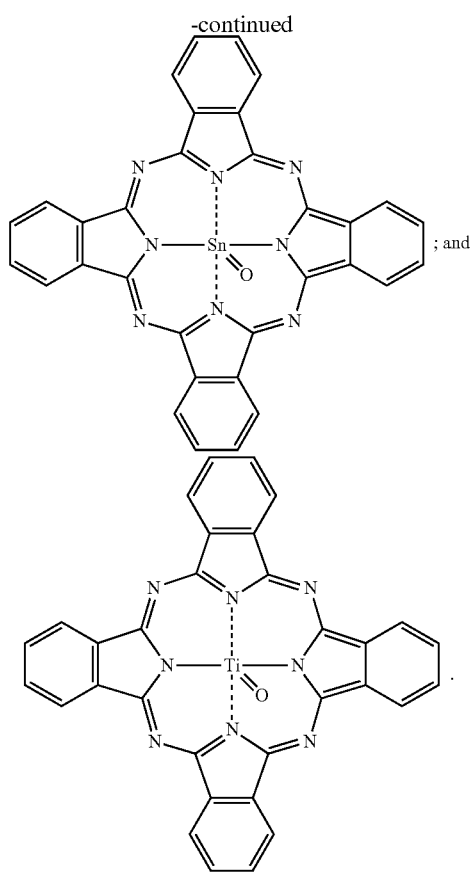

4. The light-emitting element according to claim 1, wherein the third layer further includes a substance having an electron-transport property.

5. The light-emitting element according to claim 4, wherein, in the third layer, a mass ratio of the one of the alkali metal, the alkaline-earth metal, the rare-earth metal, the alkali metal compound, the alkaline-earth metal compound, and the rare-earth metal compound to the substance having the electron-transport property is greater than or equal to 0.001:1 and less than or equal to 0.1:1.

6. The light-emitting element according to claim 1, wherein the electroluminescence layer includes a fourth layer including a substance having an electron-transport property, and
   wherein the fourth layer is in contact with the third layer.

7. The light-emitting element according to claim 1, wherein the electroluminescence layer includes a fifth layer including a second substance having a hole-transport property and a second acceptor substance with respect to the second substance having the hole-transport property, and
   wherein the fifth layer is in contact with the anode.

8. The light-emitting element according to claim 7, wherein, in the fifth layer, a mass ratio of the second acceptor substance to the second substance having the hole-transport property is greater than or equal to 0.1:1 and less than or equal to 4.0:1.

9. The light-emitting element according to claim 7, wherein the fifth layer has a stack structure of a layer including the second substance having the hole-transport property and a layer including the second acceptor substance.

10. A light-emitting device comprising the light-emitting element according to claim 1.

11. An electronic device comprising the light-emitting device according to claim 10.

12. A lighting device comprising the light-emitting device according to claim 10.

13. The light-emitting element according to claim 1, wherein the substance having the hole-transport property is any one of aromatic amine compound and carbazole derivative.

14. The light-emitting element according to claim 1, wherein the substance having the hole-transport property is 4,4'-bis[N-(1-naphthyl)-N-phenylamino]biphenyl.

15. A light-emitting element comprising:
an electroluminescence layer between an anode and a cathode;
a first layer between the cathode and the electroluminescence layer, the first layer including a substance having a hole-transport property and an acceptor substance with respect to the substance having the hole-transport property;
a second layer between the cathode and the electroluminescence layer, the second layer consisting essentially of a metal complex having a metal-oxygen double bond and an aromatic ligand; and
a third layer between the cathode and the electroluminescence layer, the third layer including one of an alkali metal, an alkaline-earth metal, a rare-earth metal, an alkali metal compound, an alkaline-earth metal compound, and a rare-earth metal compound,
wherein the first layer is provided between the cathode and the second layer and in contact with the cathode and with the second layer,
wherein the second layer is provided between the first layer and the third layer and in contact with the first layer and with the third layer, and
wherein the third layer is provided between the second layer and the electroluminescence layer and in contact with the second layer and with the electroluminescence layer.

16. The light-emitting element according to claim 15, wherein the metal complex is a phthalocyanine-based material.

17. The light-emitting element according to claim 16, wherein the phthalocyanine-based material is represented by any of structural formulae below:

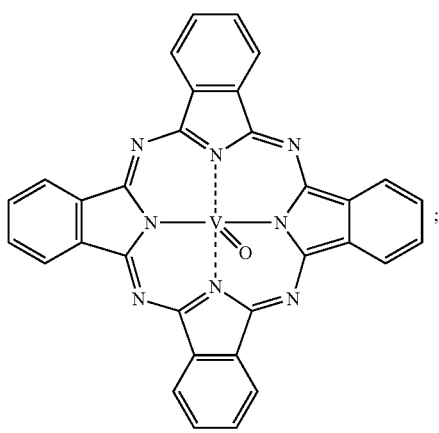

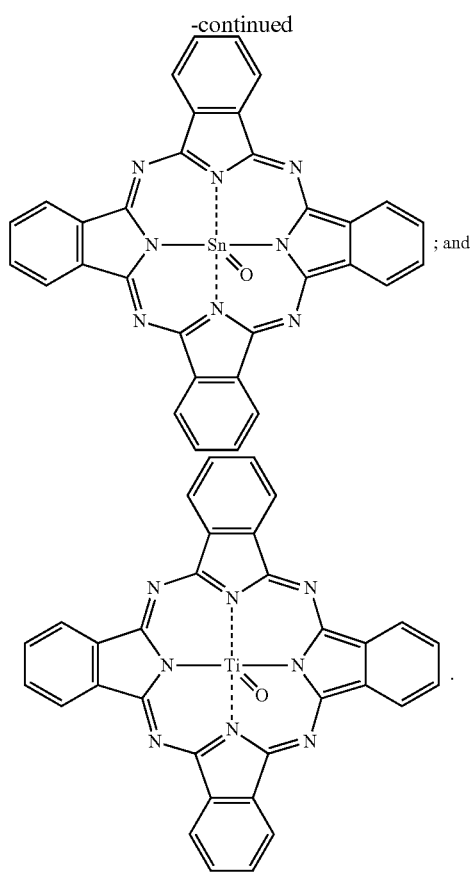

18. The light-emitting element according to claim 15, wherein the third layer further includes a substance having an electron-transport property.

19. The light-emitting element according to claim 18, wherein, in the third layer, a mass ratio of the one of the alkali metal, the alkaline-earth metal, the rare-earth metal, the alkali metal compound, the alkaline-earth metal compound, and the rare-earth metal compound to the substance having the electron-transport property is greater than or equal to 0.001:1 and less than or equal to 0.1:1.

20. The light-emitting element according to claim 15, wherein the electroluminescence layer includes a fourth layer including a substance having an electron-transport property, and
wherein the fourth layer is in contact with the third layer.

21. The light-emitting element according to claim 15, wherein, in the first layer, a mass ratio of the acceptor substance to the substance having the hole-transport property is greater than or equal to 0.1:1 and less than or equal to 4.0:1.

22. The light-emitting element according to claim 15, wherein the first layer has a stack structure of a layer including the substance having the hole-transport property and a layer including the acceptor substance.

23. The light-emitting element according to claim 15, wherein the electroluminescence layer includes a fifth layer including a second substance having a hole-transport property and a second acceptor substance with respect to the second substance having the hole-transport property, and
wherein the fifth layer is in contact with the anode.

24. The light-emitting element according to claim 23, wherein, in the fifth layer, a mass ratio of the second acceptor substance to the second substance having the hole-transport property is greater than or equal to 0.1:1 and less than or equal to 4.0:1.

25. The light-emitting element according to claim 23, wherein the fifth layer has a stack structure of a layer including the second substance having the hole-transport property and a layer including the second acceptor substance.

26. The light-emitting element according to claim 15, wherein the acceptor substance included in the first layer is an oxide of a transition metal.

27. The light-emitting element according to claim 15, wherein the acceptor substance included in the first layer is an oxide of a metal belonging to Group 4 to Group 8 in a periodic table.

28. The light-emitting element according to claim 15, wherein the acceptor substance included in the first layer is molybdenum oxide.

29. A light-emitting device comprising the light-emitting element according to claim 15.

30. An electronic device comprising the light-emitting device according to claim 29.

31. A lighting device comprising the light-emitting device according to claim 29.

32. The light-emitting element according to claim 15, wherein the substance having the hole-transport property is any one of aromatic amine compound and carbazole derivative.

33. The light-emitting element according to claim 15, wherein the substance having the hole-transport property is 4,4'-bis[N-(1-naphthyl)-N-phenylamino]biphenyl.

* * * * *

UNITED STATES PATENT AND TRADEMARK OFFICE
CERTIFICATE OF CORRECTION

PATENT NO. : 9,023,491 B2
APPLICATION NO. : 13/051104
DATED : May 5, 2015
INVENTOR(S) : Hiromi Nowatari and Satoshi Seo Page 1 of 1

It is certified that error appears in the above-identified patent and that said Letters Patent is hereby corrected as shown below:

In the Specification:

Column 9, Line 60; Change "[1',1'-biphenyl]" to --[1,1'-biphenyl]--.

Column 14, Line 26; Change "methacryla mide]" to --methacrylamide]--.

Column 15, Line 10; Change "Bis DCM)," to --BisDCM),--.

Column 15, Line 51; Change "N,N-diphenyl-[" to --N,N'-diphenyl-[--.

Column 16, Line 4; Change "methacryla mide]" to --methacrylamide]--.

Column 19, Line 5; Change "1 mm)" to --1 nm)--.

Column 37, Line 67; Change "2 mm×2 min)." to --2 mm×2 mm).--.

Column 43, Line 46; Change "2 mm" to --2 nm--.

Signed and Sealed this
Twenty-third Day of August, 2016

Michelle K. Lee
*Director of the United States Patent and Trademark Office*